United States Patent
Li et al.

(10) Patent No.: US 12,417,981 B2
(45) Date of Patent: Sep. 16, 2025

(54) SEMICONDUCTOR DEVICE INCLUDING GRAPHENE INTERCONNECT AND METHOD OF MAKING THE SEMICONDUCTOR DEVICE

(71) Applicant: TAIWAN SEMICONDUCTOR MANUFACTURING COMPANY, LTD., Hsinchu (TW)

(72) Inventors: Shu-Wei Li, Hsinchu (TW); Yu-Chen Chan, Hsinchu (TW); Shin-Yi Yang, Hsinchu (TW); Ming-Han Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 649 days.

(21) Appl. No.: 17/720,988

(22) Filed: Apr. 14, 2022

(65) Prior Publication Data
US 2023/0335497 A1 Oct. 19, 2023

(51) Int. Cl.
*H01L 23/532* (2006.01)
*H01L 21/3213* (2006.01)
*H01L 21/768* (2006.01)
*H01L 23/522* (2006.01)

(52) U.S. Cl.
CPC .. *H01L 23/53276* (2013.01); *H01L 21/32136* (2013.01); *H01L 21/32139* (2013.01); *H01L 21/76831* (2013.01); *H01L 21/76852* (2013.01); *H01L 21/76879* (2013.01); *H01L 21/76892* (2013.01); *H01L 23/5226* (2013.01)

(58) Field of Classification Search
CPC ........ H01L 23/53276; H01L 21/32136; H01L 21/32139; H01L 21/76831; H01L 21/76852; H01L 21/76879; H01L 21/76892; H01L 23/5226; H01L 21/76849; H01L 21/76885
See application file for complete search history.

(56) References Cited

U.S. PATENT DOCUMENTS

| | | | | |
|---|---|---|---|---|
| 2014/0070425 A1* | 3/2014 | Wada | ................ | H01L 21/76805 977/734 |
| 2018/0240886 A1* | 8/2018 | Venugopal | .......... | H01L 23/5225 |

* cited by examiner

*Primary Examiner* — Mohammad A Rahman
(74) *Attorney, Agent, or Firm* — Birch, Stewart, Kolasch & Birch, LLP

(57) ABSTRACT

A semiconductor device includes a semiconductor substrate, a plurality of intercalated graphene structures and a via. The intercalated graphene structures are disposed over the semiconductor substrate. Each of the intercalated graphene structures includes a plurality of graphene layers each extending substantially parallel to the semiconductor substrate. The via extends into at least a portion of one of the intercalated graphene structures toward the semiconductor substrate, and is in contact with edges of corresponding ones of the graphene layers of the one of the intercalated graphene structures.

20 Claims, 20 Drawing Sheets

SEMICONDUCTOR DEVICE INCLUDING GRAPHENE INTERCONNECT AND METHOD OF MAKING THE SEMICONDUCTOR DEVICE

BACKGROUND

With the continuous shrinking of semiconductor device dimensions, the resistivity in the semiconductor devices, such as in the back-end-of-line (BEOL) interconnect structures, increases due to the longer free path of electrons, scattering at interfaces, or other factors. Therefore, it is desirable to provide an interconnect structure that may alleviate the increase in resistivity caused by the shrinking dimensions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
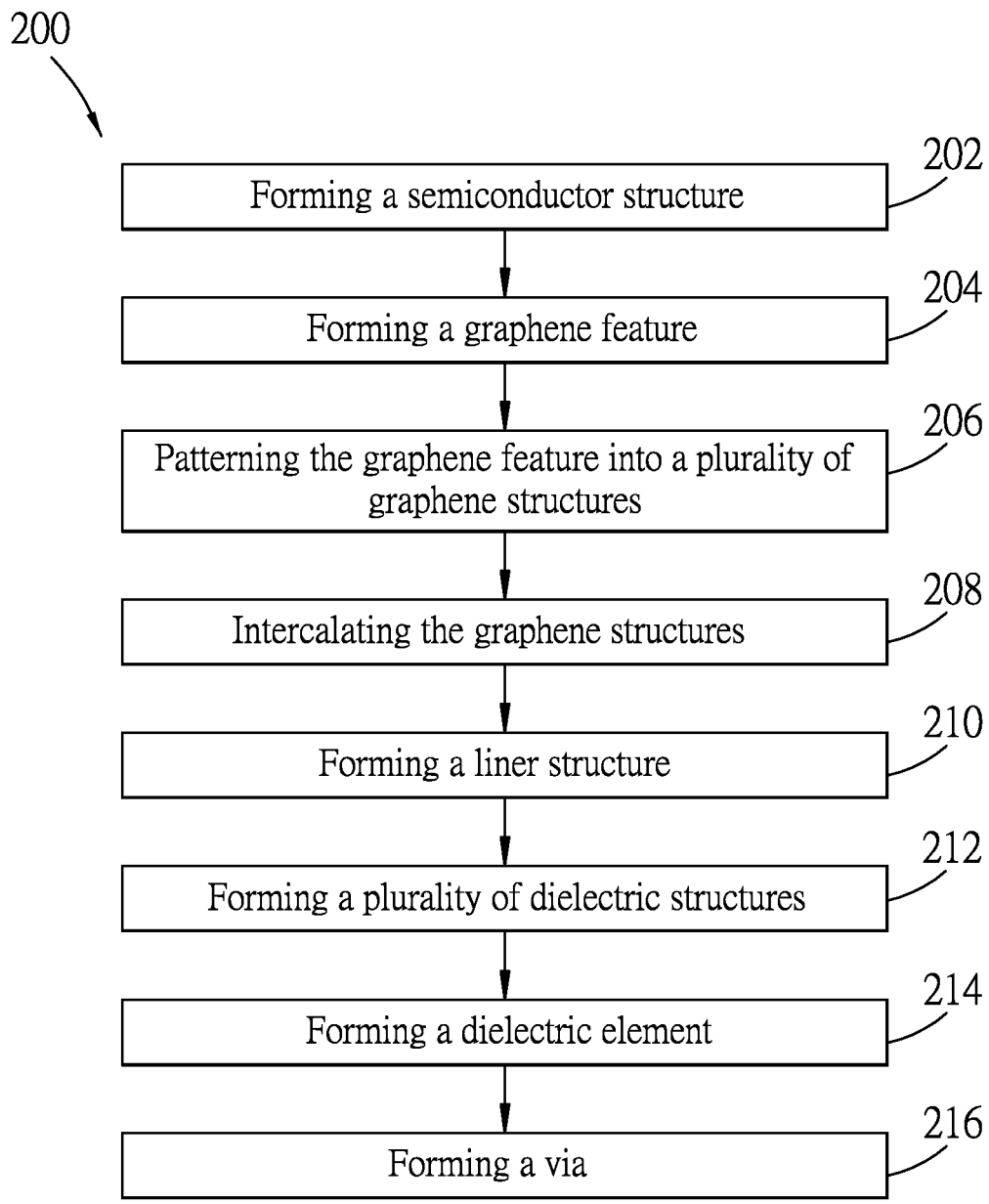
FIG. 1 illustrates a method of making a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 200 of manufacturing a semiconductor device 300 (see FIG. 13) in accordance with some embodiments of this disclosure. FIGS. 2 to 13 are schematic views showing intermediate stages of the method 200 as depicted in FIG. 1. Additional steps which are not limited to those described in the method 200, can be provided before, during or after the manufacturing of the semiconductor device 300, and some of the steps described herein may be replaced by other steps or be eliminated. Similarly, additional features may be present in the semiconductor device 300, and/or features present may be replaced or eliminated in additional embodiments.

Figure 2:
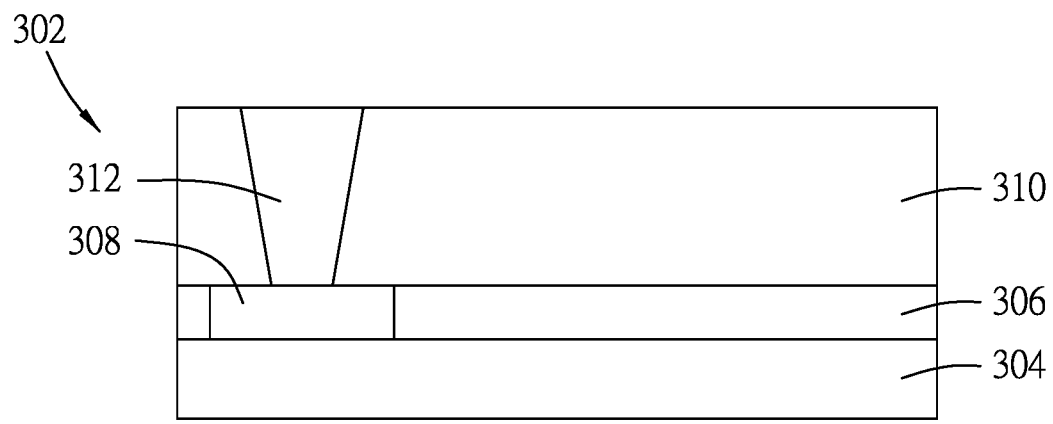
FIGS. 2 to 14 illustrate intermediate steps of a method of making a semiconductor device in accordance with some embodiments.

Referring to FIG. 1, the method 200 begins at step 202, where a semiconductor structure is formed. Referring to FIG. 2, in some embodiments, the semiconductor structure 302 includes a semiconductor substrate 304, a first dielectric layer 306 that is disposed over the semiconductor substrate 304, a semiconductor element 308 that is formed in the first dielectric layer 306, a second dielectric layer 310 that is disposed over the first dielectric layer 306, and a contact feature 312 that is formed in the second dielectric layer 310 and that is electrically connected to the semiconductor element 308.

In some embodiments, the semiconductor substrate 304 may be a suitable substrate, such as an elemental semiconductor or a compound semiconductor. The elemental semiconductor may contain a single species of atom, such as Si, Ge or other suitable materials, e.g., other elements from column XIV of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, other suitable materials, or any combination thereof.

In some embodiments, each of the first dielectric layer 306 and the second dielectric layer 310 may be made of oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, other suitable materials, or any combination thereof. In some embodiments, each of the first dielectric layer 306 and the second dielectric layer 310 may be formed by chemical vapor deposition (CVD), atomic layer deposition (ALD), physical vapor deposition (PVD), other suitable techniques, or any combination thereof. In some embodiments, each of the first dielectric layer 306 and the second dielectric layer 310 may have a dielectric constant (k value) ranging from about 1 to about 3.9, from about 1 to about 1.5, from about 1.5 to about 2, from about 2 to about 2.5, from about 2.5 to about 3, from about 3 to about 3.5, from about 3.5 to about 3.9, or may be in other suitable ranges. In some embodiments, if the dielectric constant of each of the first dielectric layer 306 and the second dielectric layer 310 is too high, such as higher than about 3.9, the resulting device may suffer from RC delay.

In some embodiments, the semiconductor element 308 may be a planar transistor, a fin field-effect transistor (Fin- FET) device, a gate-all-around (GAA) device, a nanosheet device, other suitable devices, or any combination thereof.

In some embodiments, the contact feature 312 may be a conductive metal, a via, or other suitable structures, that is electrically connected to the semiconductor element 308, such as one of a source, a drain, and a gate of the semiconductor element 308.

Figure 3:
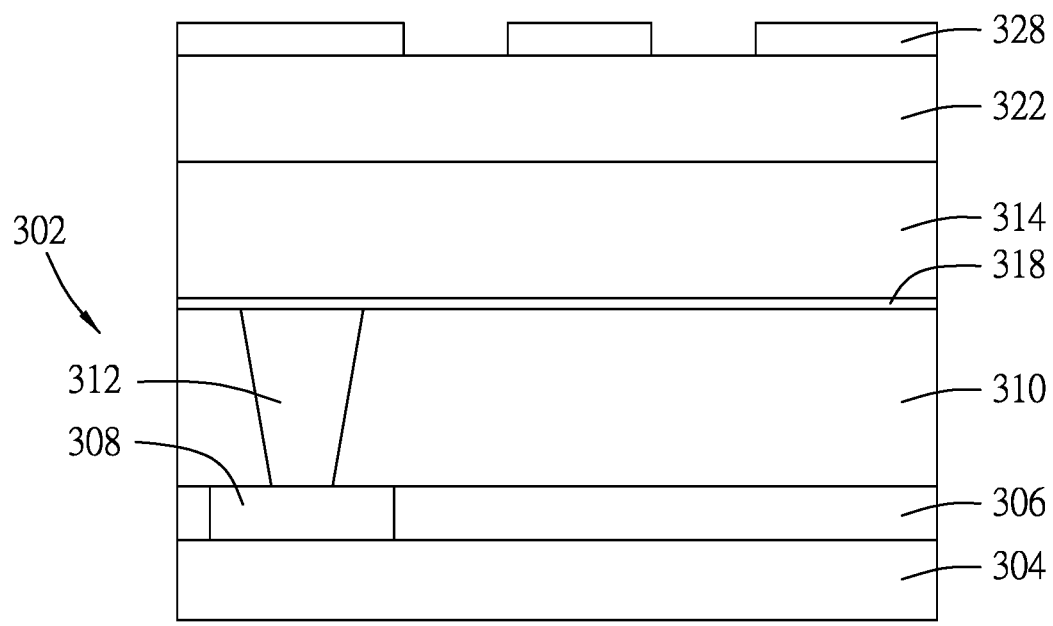

Referring to FIG. 1, in a step 204 of the method 200, a graphene feature is formed. Referring to FIG. 3, in some embodiments, the graphene feature 314 is formed over the semiconductor structure 302. In some embodiments, the graphene feature 314 may be made of multiple graphene layers 316 (see FIG. 7) that are stacked over the semiconductor structure 302, and each of the graphene layers 316 extends substantially parallel to the semiconductor substrate 304. In some embodiments, the graphene feature 314 may be formed by CVD, ALD, other suitable techniques, or any combination thereof, which may be assisted by inductively coupled plasma (ICP), microwave plasma (MW), electron cyclotron resonance (ECR) plasma, or other suitable types of plasma. In some embodiments, the precursor used for forming the graphene feature 314 may be organic materials (e.g., aliphatic compounds, aromatic compounds, or other suitable organic materials), inorganic materials (e.g., carbon-based perovskite materials, or other suitable inorganic materials), other suitable materials, or any combination thereof. The precursor may be solid, liquid, or gas.

Referring to FIG. 3, in some embodiments, before forming the graphene feature 314, a liner layer 318 is formed over the semiconductor structure 302, followed by forming the graphene feature 314 over the liner layer 318. In some embodiments, the liner layer 318 may be made of Ti, TiN, Ru, Ta, TaN, Co, Ni, Cu, W, WN, WC, SiN, SiO, transition metal dichalcogenide (TMD) monolayer, other suitable materials, or any combination thereof. In some embodiments, the liner layer 318 may be formed by PVD, CVD, ALD, other suitable techniques, or any combination thereof. In some embodiments, the liner layer 318 may improve adhesion of the graphene feature 314 to the second dielectric layer 310.

Referring to FIG. 1, in a step 206 of the method 200, the graphene feature is patterned into a plurality of graphene structure. Referring further to FIG. 3, a hard mask feature 322 may be formed over the graphene feature 314. In some embodiments, the hard mask feature 322 may be made of oxide-based materials, nitride-based materials, carbide-based materials, other suitable materials, or any combination thereof. In some embodiments, the hard mask feature 322 may be formed by CVD, PVD, ALD, other suitable techniques, or any combination thereof. In some embodiments, a patterned photoresist 328 may be formed over the hard mask feature 322 for defining regions that are to be etched in subsequent steps. Then, referring to FIGS. 3 and 4, the hard mask feature 322 may be patterned into a plurality of hard mask structures 324 by using the patterned photoresist 328 as a mask, followed by patterning the graphene feature 314 into a plurality of the graphene structures 320 by using the hard mask structures 324 as a mask. In some embodiments, each of the hard mask feature 322 and the graphene feature 314 may be patterned by plasma dry etching, other suitable techniques, or any combination thereof. In some embodiments, the liner layer 318 may serve as an etch stop layer for etching the graphene feature 314, and may be etched when patterning the graphene feature 314. In some embodiments, during the process of patterning the graphene feature 314, a plurality of graphene trenches 330 are formed in the graphene feature 314, so that the graphene feature 314 is patterned into the graphene structures 320. In some embodiments, the graphene trenches 330 may penetrate the liner layer 318.

Figure 4:
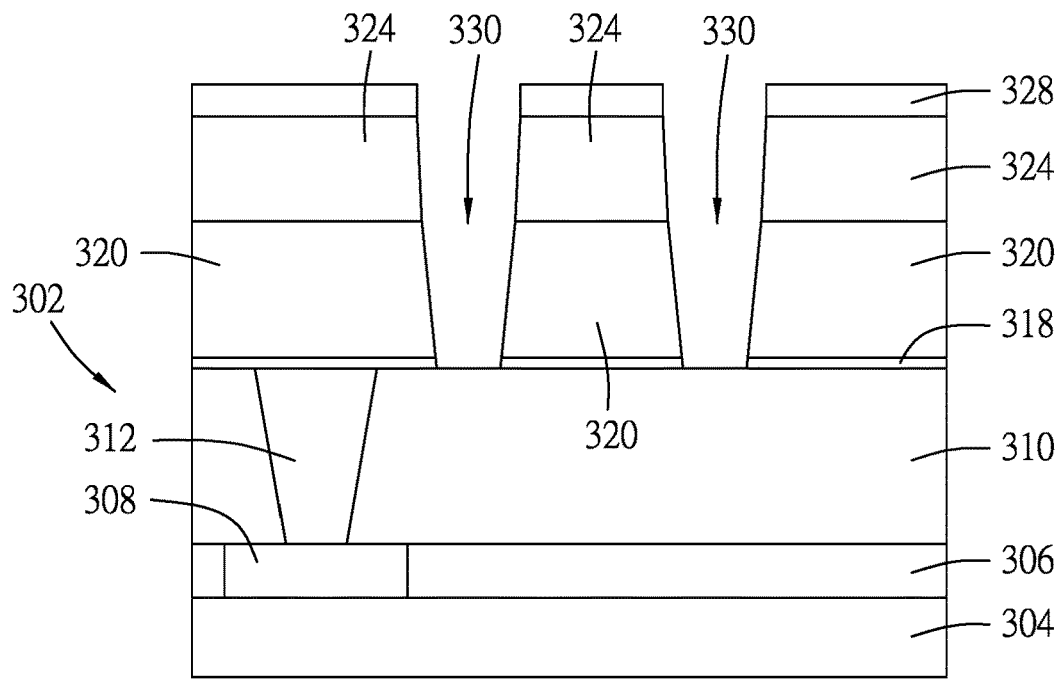
Figure 5:
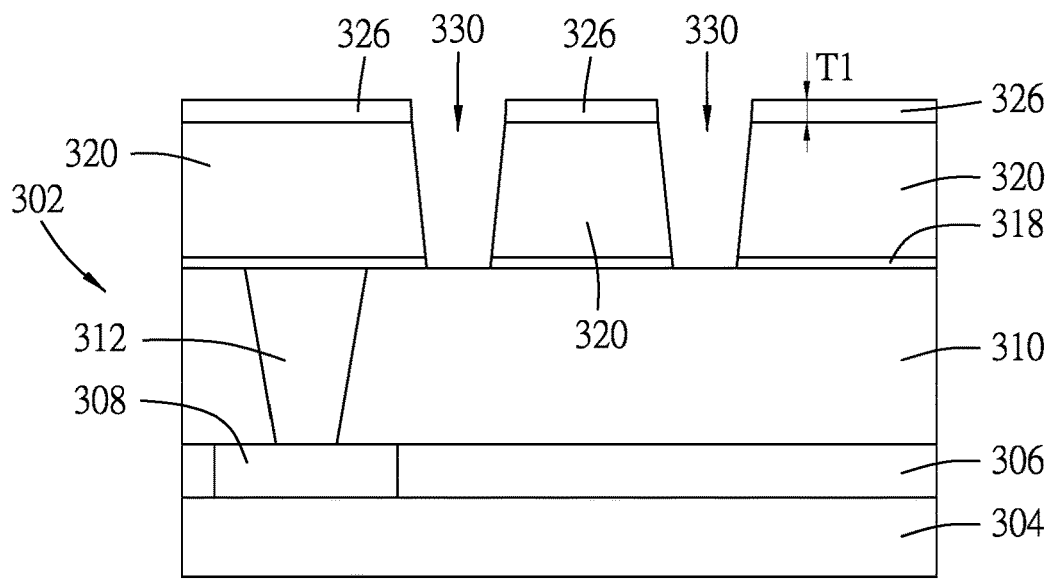

After patterning the graphene feature 314 (see FIG. 3), the hard mask structures 324 and the patterned photoresist layer 328 (see FIG. 4) may be removed. Referring to FIGS. 4 and 5, in some embodiments, the entire patterned photoresist layer 328 and top portions of the hard mask structures 324 may be removed, leaving bottom portions of the hard mask structures 324 so as to form a plurality of protection structures 326 over the graphene structures 320. In some embodiments, the removing process may be conducted by chemical mechanical planarization (CMP), dry etch, wet etch, other suitable techniques, or any combination thereof. In some embodiments, the protection structures 326 may protect the graphene structures 320 in subsequent manufacturing processes. In some embodiments, each of the protection structures 326 has a thickness (T1) that may range from about 15 Å to about 100 Å, but other ranges of values are also within the scope of this disclosure. In some embodiments, if the thickness (T1) of each of the protection structures 326 is too small, such as smaller than about 15 Å, the protection structures 326 may not sufficiently protect the graphene structures 320 in subsequent manufacturing processes. In some embodiments, if the thickness (T1) of each of the protection structures 326 is too large, such as greater than about 100 Å, the aspect ratio of each of the graphene trenches 330 may be higher, making it more difficult to fill the graphene trenches 330 in subsequent manufacturing processes.

Figure 6:
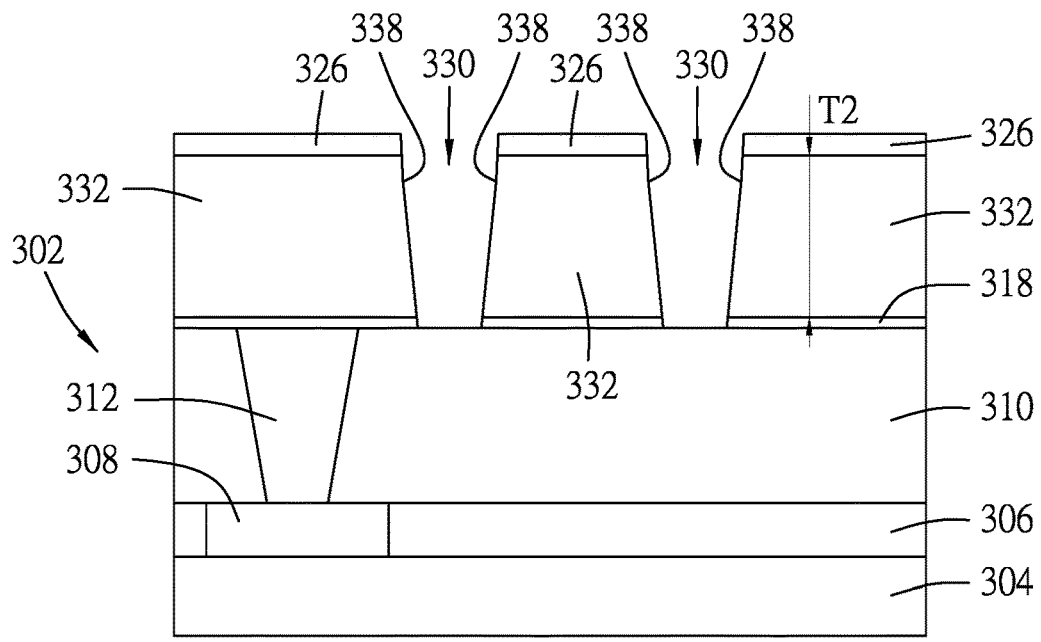
Figure 7:
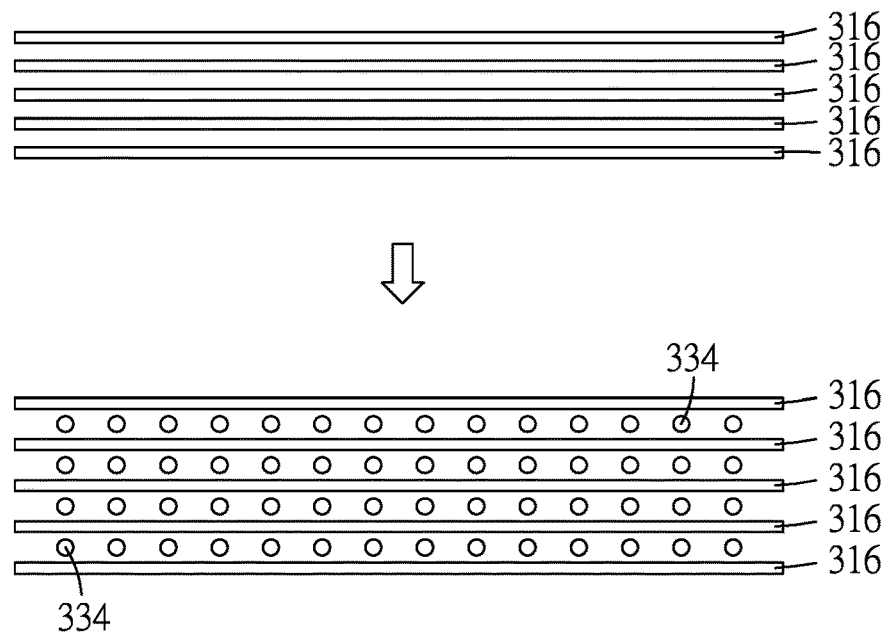

Referring to FIG. 1, in a step 208 of the method 200, the graphene structures are intercalated. Referring to FIGS. 5 to 7, in some embodiments, the graphene structures 320 may be intercalated with a plurality of intercalants 334, so that the graphene structures 320 are turned into a plurality of intercalated graphene structures 332. As schematically shown in FIG. 7, after intercalation, the intercalants 334 enter the spaces among the graphene layers 316, and the graphene layers 316 are moved further away from each other. Although FIG. 7 shows a stage 1 intercalation, the intercalation stage of each of the intercalated graphene structures 332 may range from stage 1 to stage 10. In some embodiments, if the intercalation stage of each of the intercalated graphene structures 332 is too high, such as greater than stage 10, the electric conductivity of the intercalated graphene structure 332 may not be high enough for electrical connection. In some embodiments, the intercalants 334 may include metal (e.g., Li, K, Cs, Na, other suitable types of metal, or any combination thereof) or its ion/complex, inorganic compounds (e.g., $FeCl_3$, $MoCl_5$, $AuCl_3$, $CuCl_2$, $H_2SO_4$, $AlCl_3$, $Br_2$, $Cl_2$, $HNO_3$, oxide-based compounds (e.g., $TiO_2$, $Cr_3O_4$, etc.), other suitable inorganic compounds, or any combination thereof), organic compound (e.g., benzene, pyridine, furan, catechol, other suitable organic compounds, or any combination thereof), polymer or oligomer (e.g., polymethyl methacrylate (PMMA), polystyrene (PS), polycaprolactam (PA6), other suitable types of polymer or oligomer, or any combination thereof). In some embodiments, the intercalation process may be carried out in a CVD system, a liquid electrolysis system, other suitable process systems, or any combination thereof. In some embodiments, each of the intercalated graphene structures 332 has a thickness (T2) that may range from about 50 Å to about 1000 Å, but other ranges of values are also within the scope of this disclosure. In other embodiments, the thickness (T2) of each of the intercalated graphene structures 332 may be as low as about 9 Å (i.e., two graphene layers 316 with the intercalants 334 disposed therebetween) or even only one graphene layer 316, depending on practical requirements. In some embodiments, the number of the graphene layer(s) 316 of each of the intercalated graphene structures 332 may range from 1 to about 300, but other ranges of values are also within the scope of this disclosure. In some embodiments, if the thickness (T2) of each of the intercalated graphene structures 332 is too large, such as greater than about 1000 Å, the aspect ratio of each of the graphene trenches 330 may be higher, making it more difficult to fill the graphene trenches 330 in subsequent manufacturing processes. In some embodiments, if the number of the graphene layers 316 of each of the intercalated graphene structures 332 is too large, such as greater than about 300, the aspect ratio of each of the graphene trenches 330 may be higher, making it more difficult to fill the graphene trenches 330 in subsequent manufacturing processes.

Figure 8:
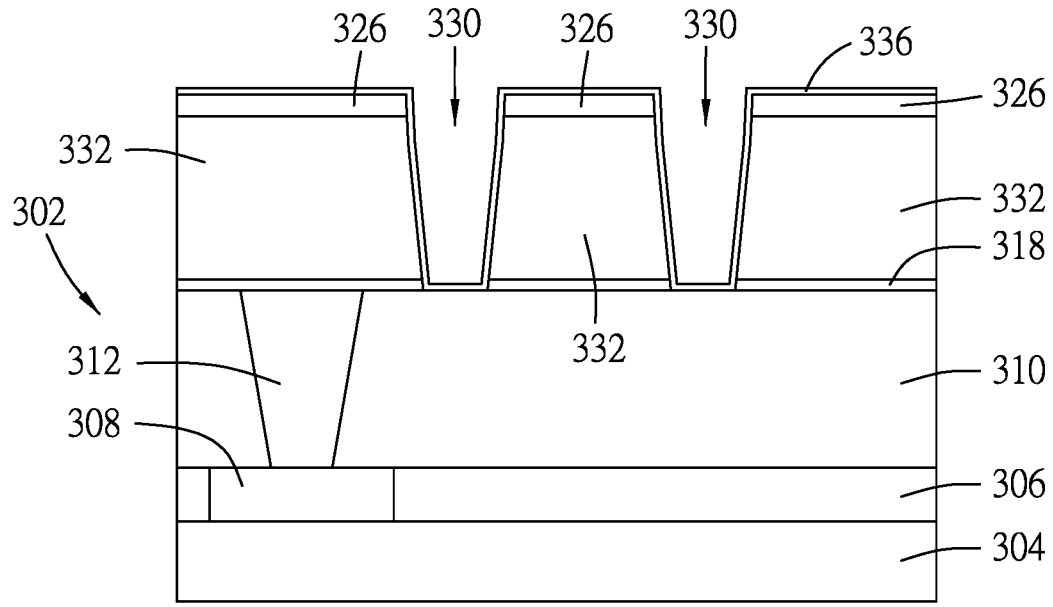

Referring to FIG. 1, in a step 210 of the method 200, a liner structure is formed. Referring to FIG. 8, in some embodiments, the liner structure 336 is formed over the protection structures 326, is formed in the graphene trenches 330, and covers side walls 338 of the intercalated graphene structures 332 (see FIG. 6). In some embodiments, the liner structure 336 may be made of Ti, TiN, Ru, Ta, TaN, Co, Ni, Cu, W, WN, WC, SiN, SiO, transition metal dichalcogenide monolayer (TMD), other suitable materials, or any combination thereof. In some embodiments, the liner structure 336 may be made by PVD, CVD, ALD, other suitable techniques, or any combination thereof.

Figure 9:
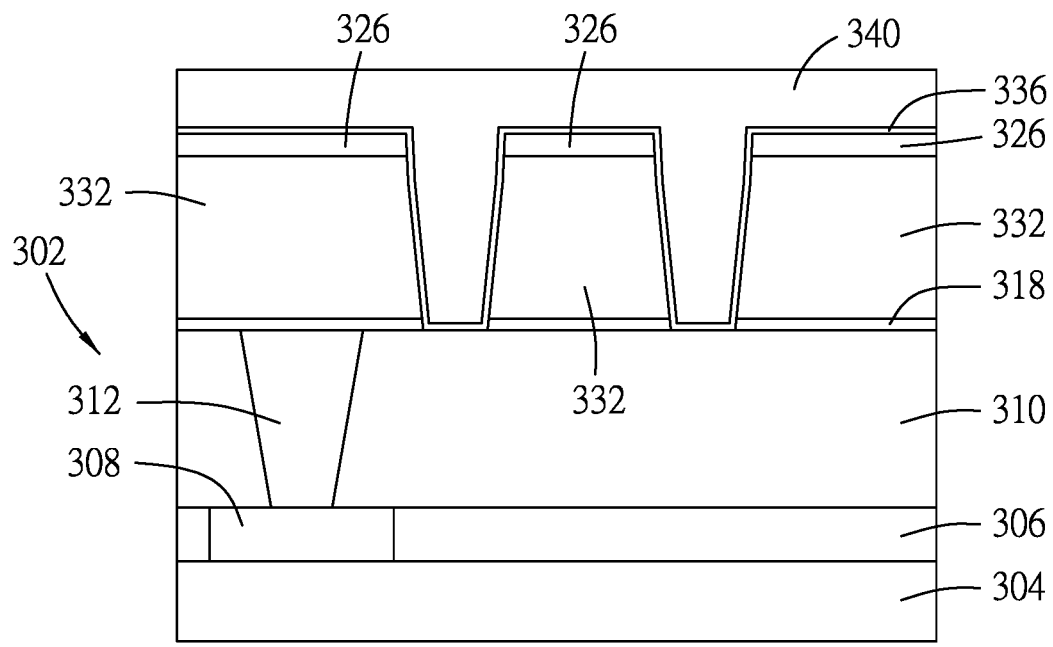
Figure 10:
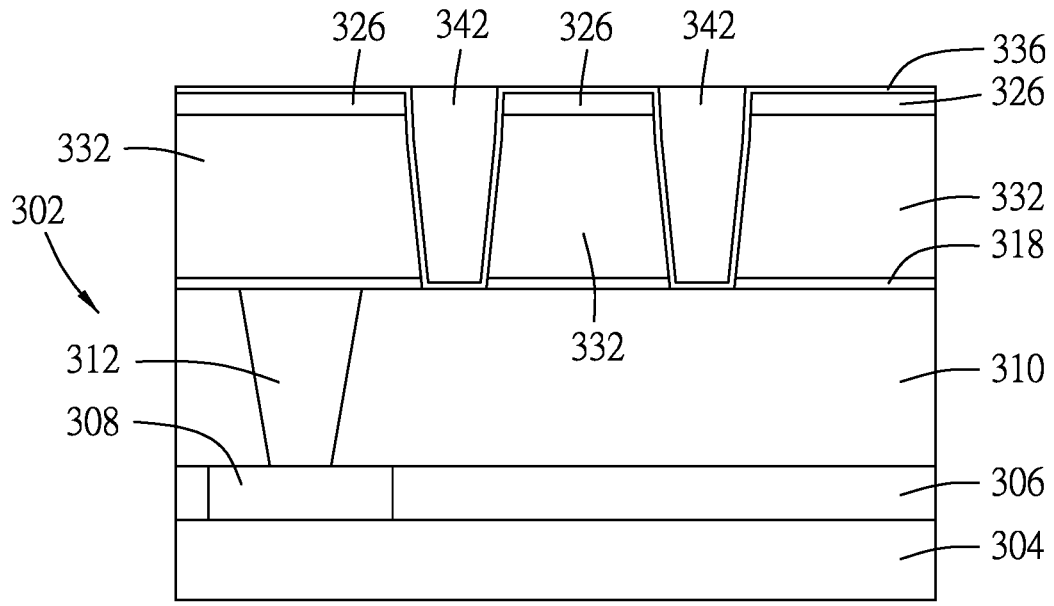

Referring to FIG. 1, in a step 212 of the method 200, a plurality of dielectric structures are formed. Referring to FIG. 9, after forming the liner structure 336, a dielectric assembly 340 is formed over the liner structure 336 and in the graphene trenches 330 (see FIG. 8). Then, referring further to FIG. 10, a top portion of the dielectric assembly 340 is removed to obtain the dielectric structures 342 respectively filling the graphene trenches 330, where the dielectric structures 342 separate the intercalated graphene structures 332 from each other and separate the protection structures 326 from each other. In some embodiments, the top portion of the dielectric assembly 340 may be removed by CMP, dry etch, wet etch, other suitable techniques, or any combination thereof. In some embodiments, the liner structure 336 may serve as a stop layer when removing the top portion of the dielectric assembly 340; in other embodiments, the liner structure 336 over the protection structures 326 may be removed during the removing process and the protection structures 326 may serve as an etch stop layer when removing the top portion of the dielectric assembly 340. In some embodiments, the liner structure 336 may promote adhesion of the dielectric structures 342 to the intercalated graphene structures 332 and the second dielectric layer 310, may fix the intercalated graphene structures 332 to the second dielectric layer 310, and may prevent the intercalants 334 (see FIG. 7) from exiting the intercalated graphene structures 332. In some embodiments, the dielectric assembly 340 (i.e., the dielectric structures 342) may be made of oxides such as silicon oxide, BPSG, USG, FSG, low-k dielectrics such as carbon doped oxides, extremely low-k dielectrics such as porous carbon doped silicon dioxide, a polymer such as polyimide, other suitable materials, or any combination thereof. In some embodiments, the dielectric assembly 340 may be formed by CVD, ALD, PVD, other suitable techniques, or any combination thereof.

Figure 11:
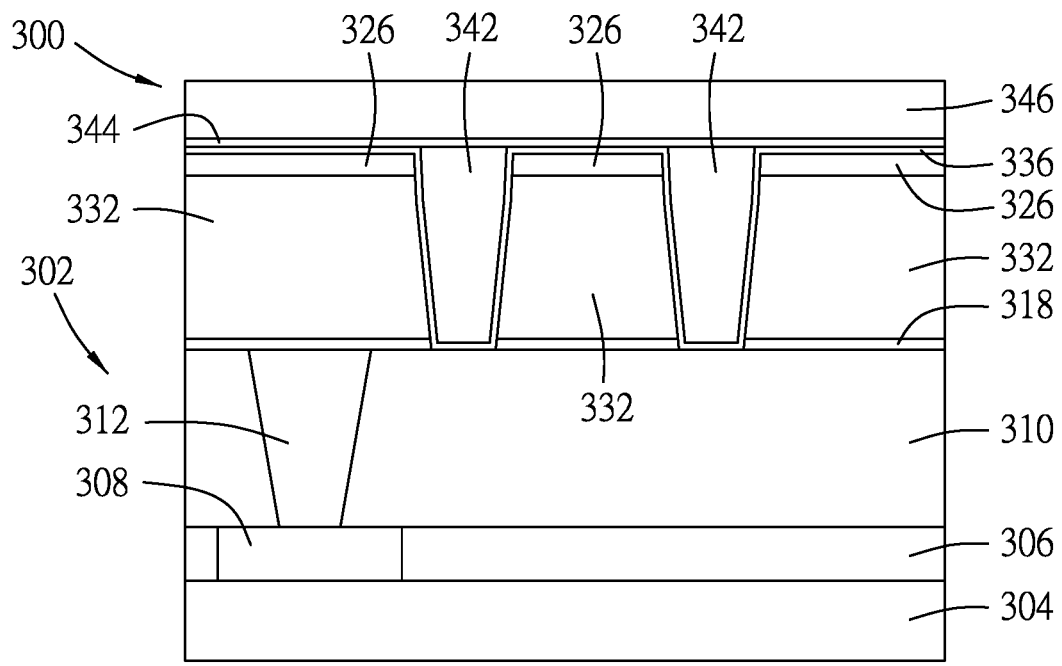

Referring to FIG. 1, in a step 214 of the method 200, a dielectric element is formed. Referring to FIG. 11, the dielectric element 346 may be formed over the protection structures 326. In some embodiments, the dielectric element 346 may be made of oxides such as silicon oxide, BPSG, USG, FSG, low-k dielectrics such as carbon doped oxides, extremely low-k dielectrics such as porous carbon doped silicon dioxide, a polymer such as polyimide, other suitable materials, or any combination thereof. In some embodiments, the dielectric element 346 may be formed by CVD, ALD, PVD, other suitable techniques, or any combination thereof. In some embodiments, before forming the dielectric element 346, an etch stop layer 344 may be formed over the protection structures 326. In some embodiments, the etch stop layer 344 may be made of oxide-based materials, nitride-based materials, carbide-based materials, other suitable materials, or any combination thereof. In some embodiments, the etch stop layer 344 may be made by CVD, PVD, ALD, other suitable techniques, or any combination thereof. Then, referring to FIG. 12, a via opening 348 is formed to penetrate the dielectric element 346, the etch stop layer 344, a corresponding one of the protection structures 326, a corresponding one of the intercalated graphene structures 332, and the liner layer 318. Afterwards, referring to FIG. 13, a via 350 is formed in the via opening 348 (FIG. 12), thereby obtaining the semiconductor device 300. In some embodiments, the via 350 may be made by forming a conductive material in the via opening 348 and over the dielectric element 346, followed by removing the conductive material over the dielectric element 346 by CMP, dry etch, wet etch, other suitable techniques, or any combination thereof. In some embodiments, the conductive material (i.e., the via 350) may be made of Co, Cu, Ni, Ru, W, Mo, Ti, Zr, Ta, Zn, other suitable conductive materials, or any combination thereof. In some embodiments, the conductive material may be formed by CVD, ALD, PVD, electroless deposition (ELD), electrochemical plating (ECP), other suitable techniques, or any combination thereof. In some embodiments, the via 350 may have a height (H1) ranging from about 50 Å to about 1000 Å, from about 1000 Å to about 1500 Å, or it may be in other suitable ranges. In some embodiments, if the height (H1) of the via 350 is too small, such as smaller than about 50 Å, the via 350 may not penetrate deep enough to be connected to the corresponding one of the intercalated graphene structures 332. In some embodiments, if the height (H1) of the via 350 is too large, such as greater than about 1500 Å, this means that the aspect ratio of the via opening 348 (FIG. 12) may be higher, and it may be difficult to completely fill the via opening 348. In some embodiments, the via 350 may be a single column (i.e., having a circular, square, or rectangular top view); in other embodiments, the via 350 may be a rail with an elongated top view. In some embodiments, there may be multiple vias 350 (only one is schematically shown in FIG. 13) that are connected to the corresponding ones of the intercalated graphene structures 332. In some embodiments, the three intercalated graphene structures 332 shown in FIG. 13 may be separated from each other by the dielectric structures 342, and the via 350 is only connected to the corresponding one of the intercalated graphene structures 332 (i.e., the middle one of the intercalated graphene structures 332 shown in FIG. 13). There may be other vias (not shown) that penetrate and are connected to the other two of the intercalated graphene structures 332 (i.e., the left and right intercalated graphene structures 332 shown in FIG. 13).

Figure 14:
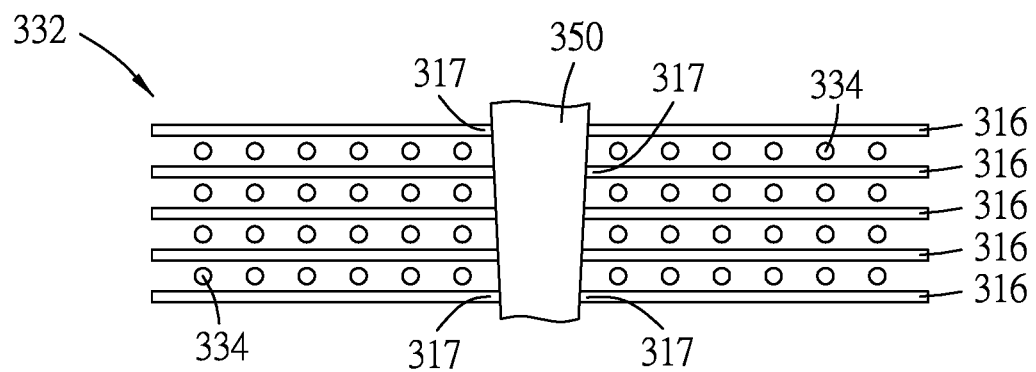

As schematically shown in FIG. 14, in some embodiments, the via 350 may be referred to as an edge contact via since it only contacts the edges 317 of the graphene layers 316, instead of landing on top of the topmost graphene layer 316. Compared to landing a via on a topmost graphene layer, such an edge contact feature would provide a lowered resistance. In some embodiments, other interconnect structures below or over the intercalated graphene structures 332 may be metal interconnects (e.g., single or dual damascene metal interconnects) or may be edge-contact intercalated graphene structures. That is, the intercalated graphene structures 332 of this disclosure may be used for replacing all of the metal interconnects or only certain layers of the metal interconnects.

Figure 12:
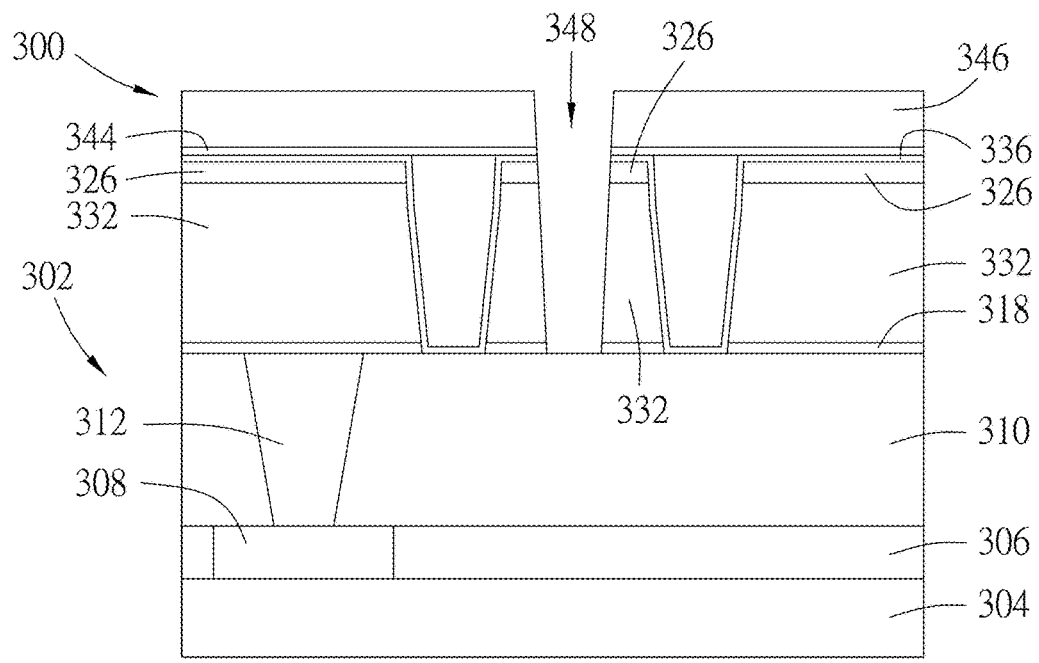
Figure 13:
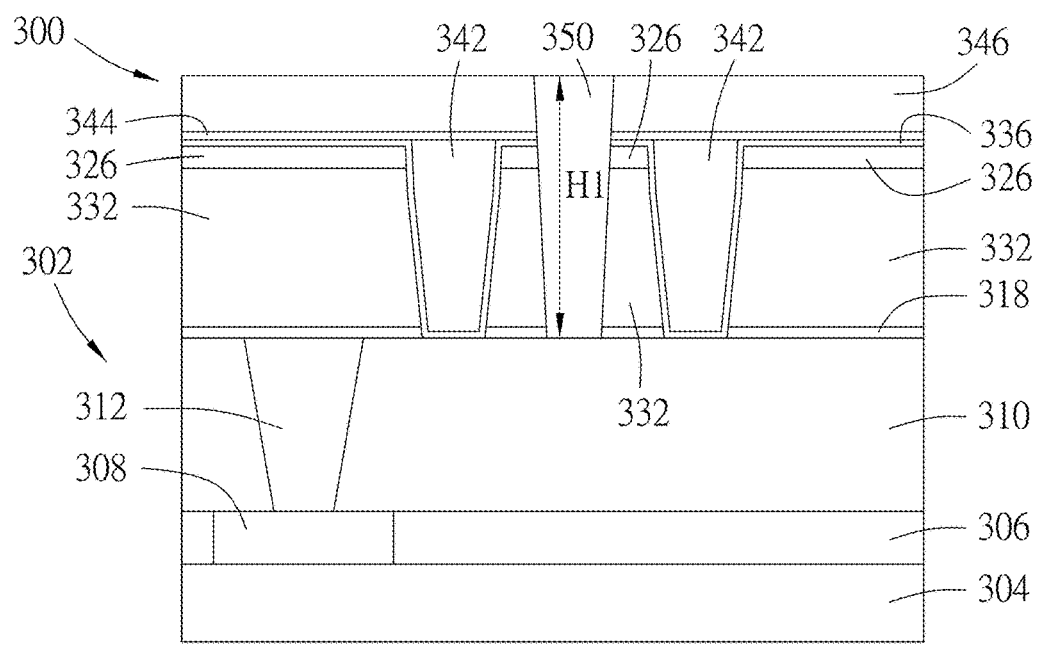
Figure 15:
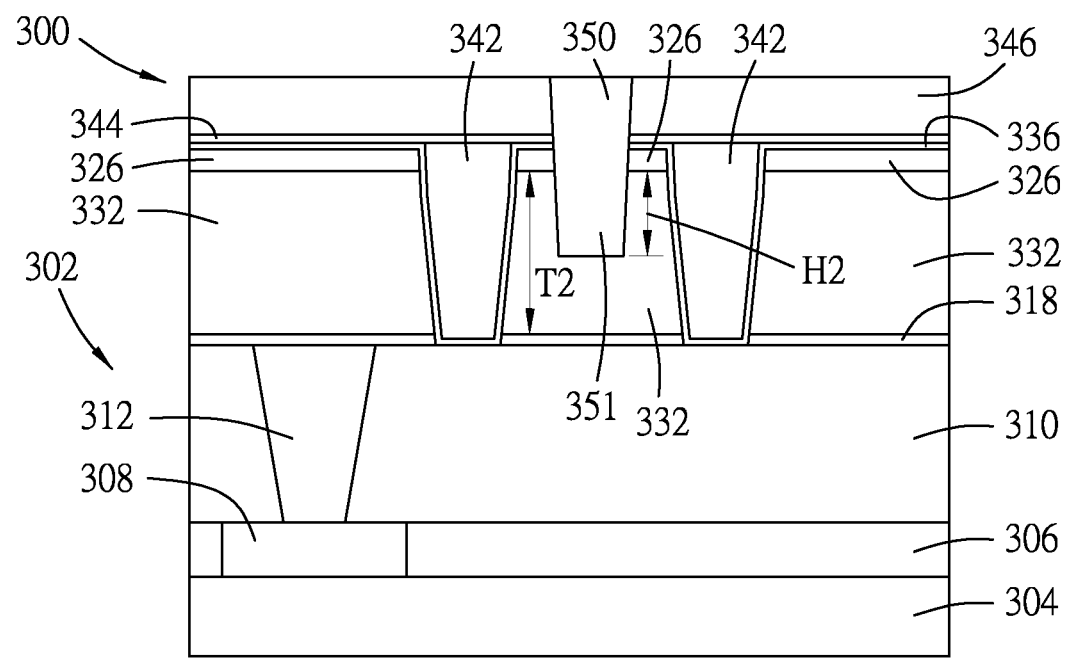
FIG. 15 illustrates an embodiment of a semiconductor device in accordance with some embodiments.

Referring to FIG. 15, in some embodiments, the via 350 may only penetrate a portion of the corresponding one of the intercalated graphene structures 332 (i.e., the via opening 348 shown in FIG. 12 only penetrates a portion of the corresponding one of the intercalated graphene structures 332). In some embodiments, a portion 351 of the via 350 extending into the corresponding one of the intercalated graphene structures 332 may have a height (H2), where the height (H2) of the portion 351 of the via 350 may be at least one-third of the thickness (T2) of the corresponding one of the intercalated graphene structures 332. In some embodiments, if the height (H2) of the portion 351 of the via 350 is too small, such as smaller than one-third of the thickness (T2) of the corresponding one of the intercalated graphene structures 332, the resistivity of the semiconductor device 300 may be increased.

Figure 16:
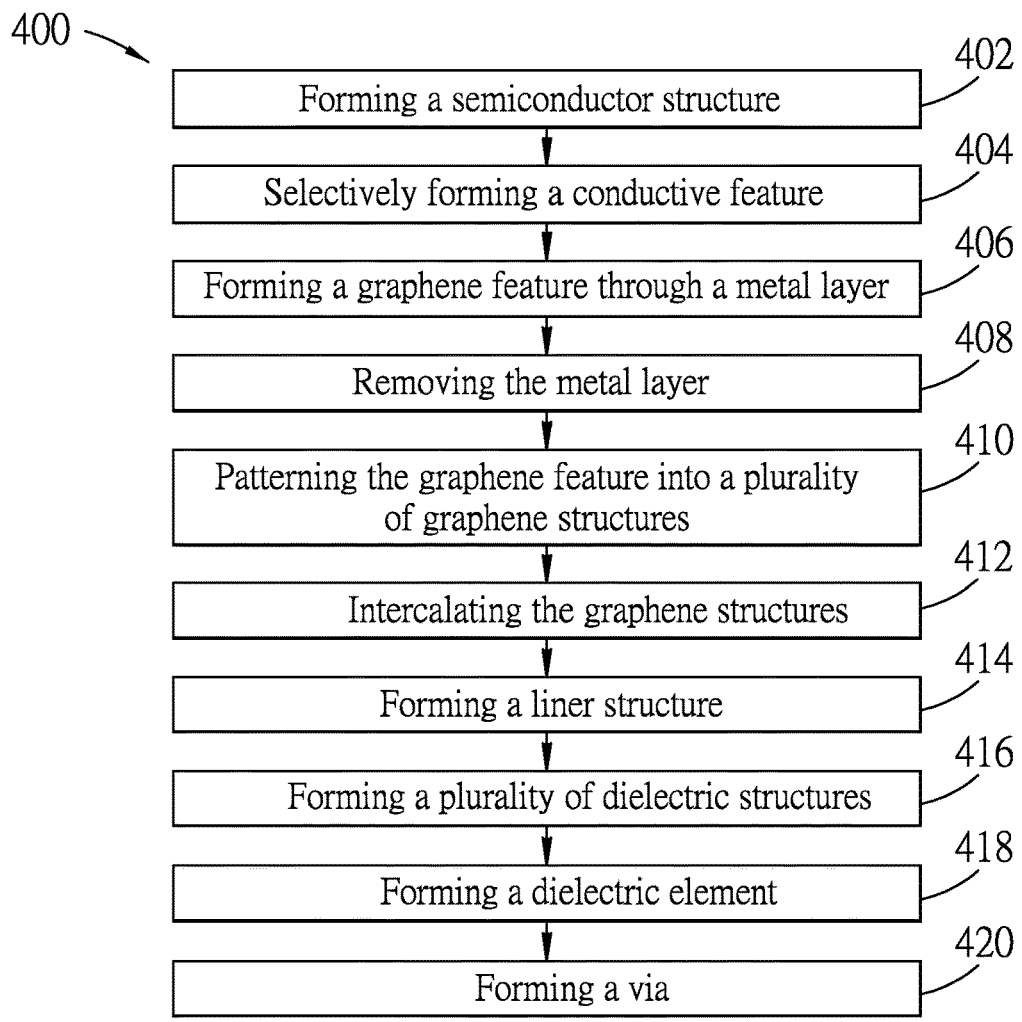
FIG. 16 illustrates a method of making a semiconductor device in accordance with some embodiments.
Figure 24:
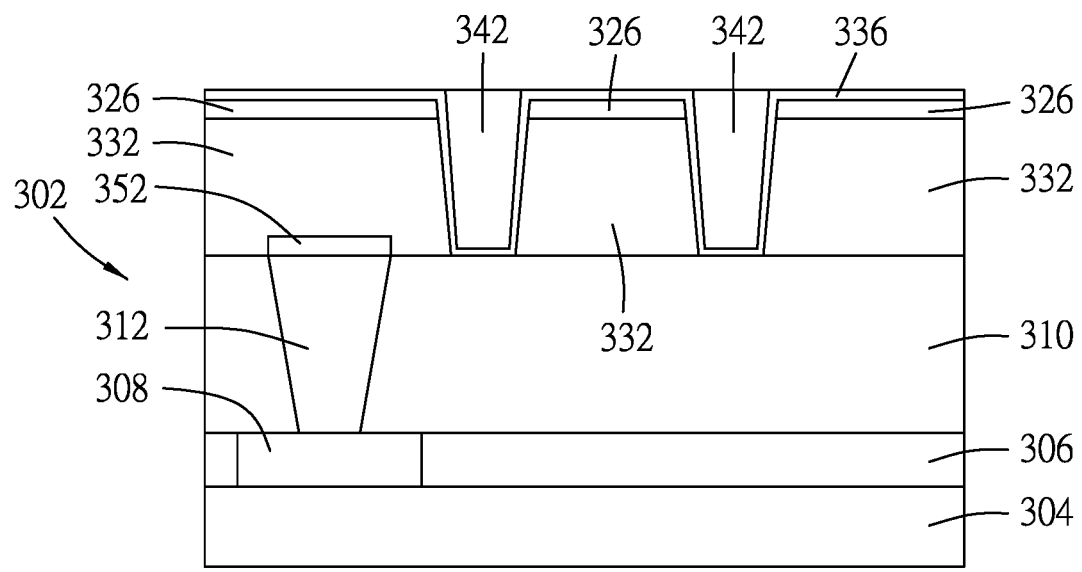
Figure 25:
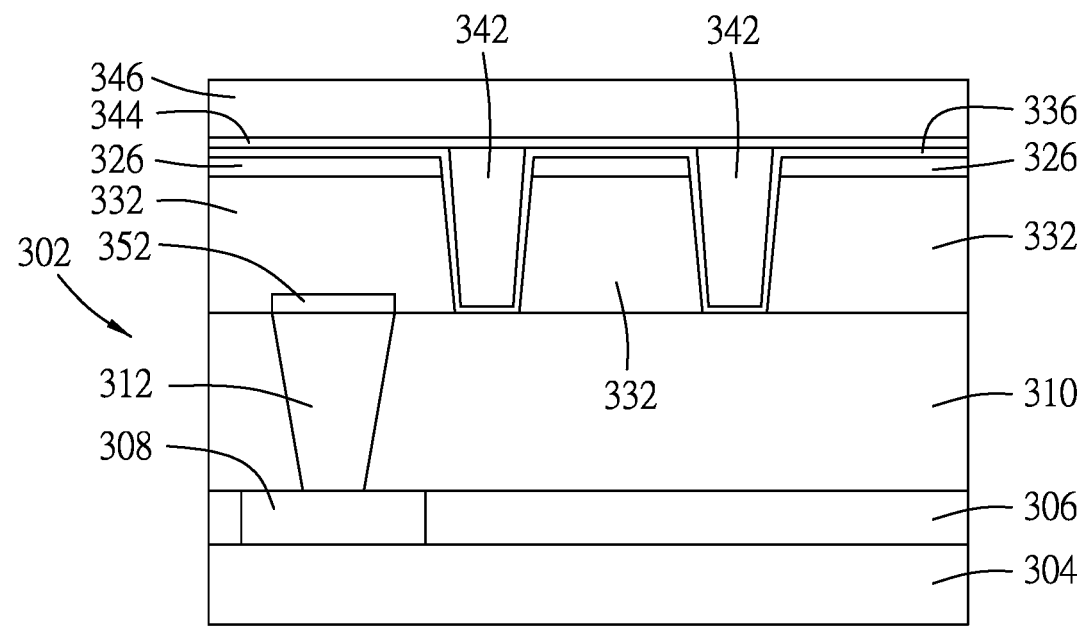
Figure 26:
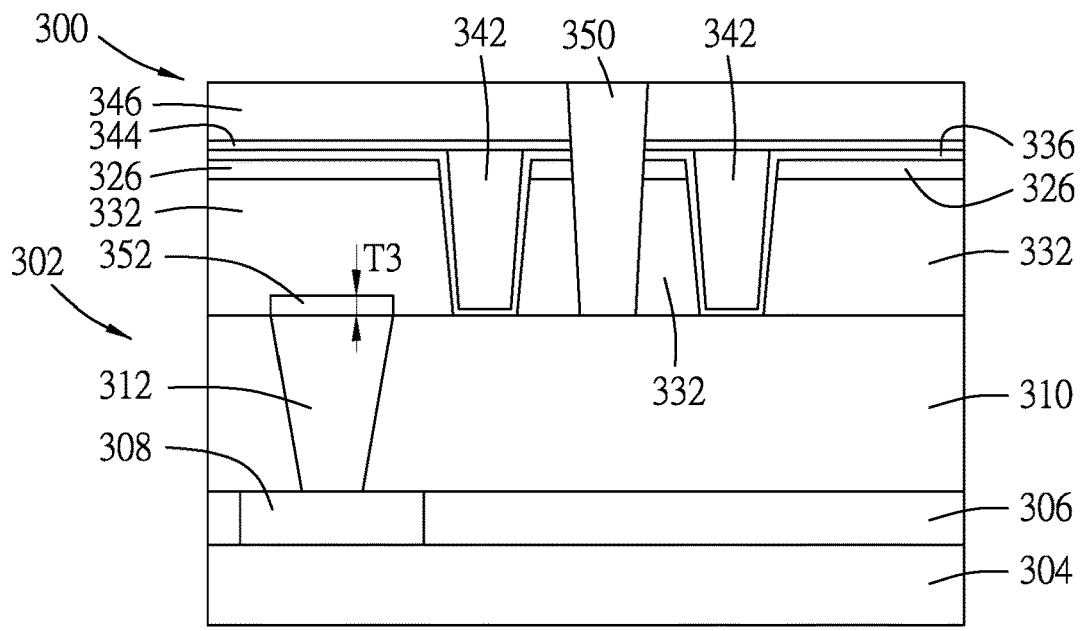

FIG. 16 illustrates a method 400 of manufacturing the semiconductor device 300 shown in FIG. 26 in accordance with some embodiments of this disclosure. FIGS. 17 to 26 are schematic views showing intermediate stages of the method 400 as depicted in FIG. 16. Additional steps which are not limited to those described in the method 400, can be provided before, during or after manufacturing of the semiconductor device 300, and some of the steps described herein may be replaced by other steps or be eliminated. Similarly, additional features may be present in the semiconductor device 300 of FIG. 26, and/or features present may be replaced or eliminated in additional embodiments. Details of the semiconductor device 300, including materials, techniques of manufacturing, dimensions, etc. mentioned above are not repeated hereinafter for the sake of brevity, and adjustments can be made according to practical requirements.

Figure 17:
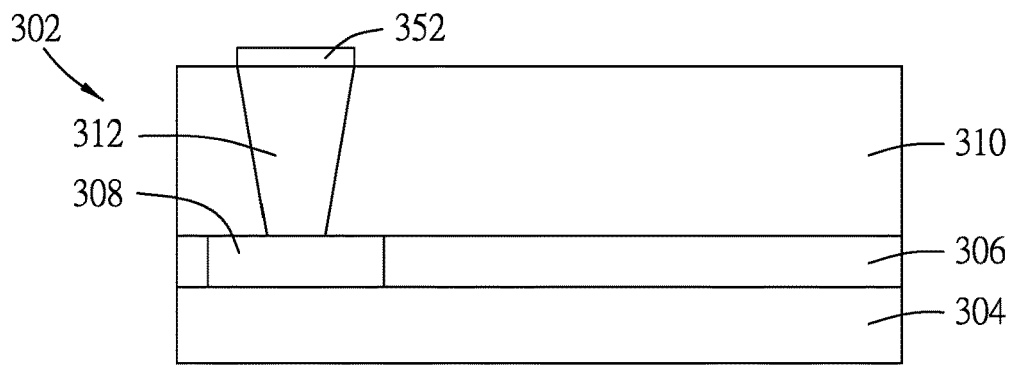
FIGS. 17 to 26 illustrate intermediate steps of a method of making a semiconductor device in accordance with some embodiments.

Referring to FIGS. 16 and 17, in a step 402 of the method 400, the semiconductor structure 302, which is similar to the semiconductor structure 302 of FIG. 2, is formed. Then, in a step 404 of the method 400, a conductive feature is selectively formed. As shown in FIG. 17, in some embodiments, the conductive feature 352 may be selectively formed on the contact feature 312 without forming on the second dielectric layer 310. In some embodiments, the conductive feature 352 may be selectively formed on the contact feature 312 without contacting the second dielectric layer 310 by using a suitable precursor that only reacts with the contact feature 312 (i.e., the conductive feature 352 is formed as a result of a metal-to-metal interaction). In some embodiments, the conductive feature 352 may be made of Co, Cu, Ni, Ru, W, Mo, Ti, Zr, Ta, Zn, other suitable conductive materials, or any combination thereof. In some embodiments, the conductive feature 352 may be made by CVD, ALD, ELD, ECP, other suitable techniques, or any combination thereof.

Figure 18:
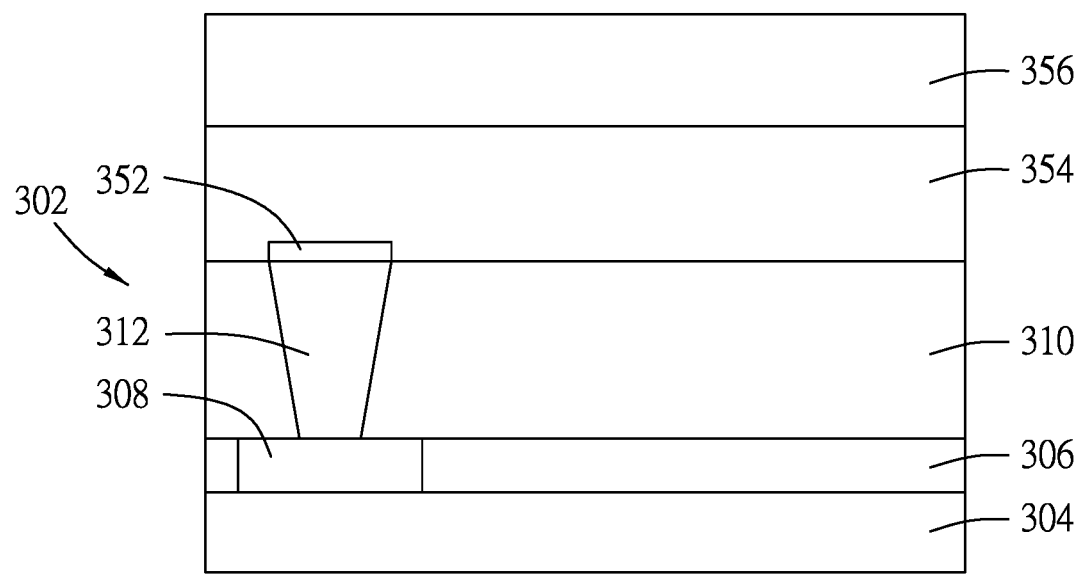
Figure 19:
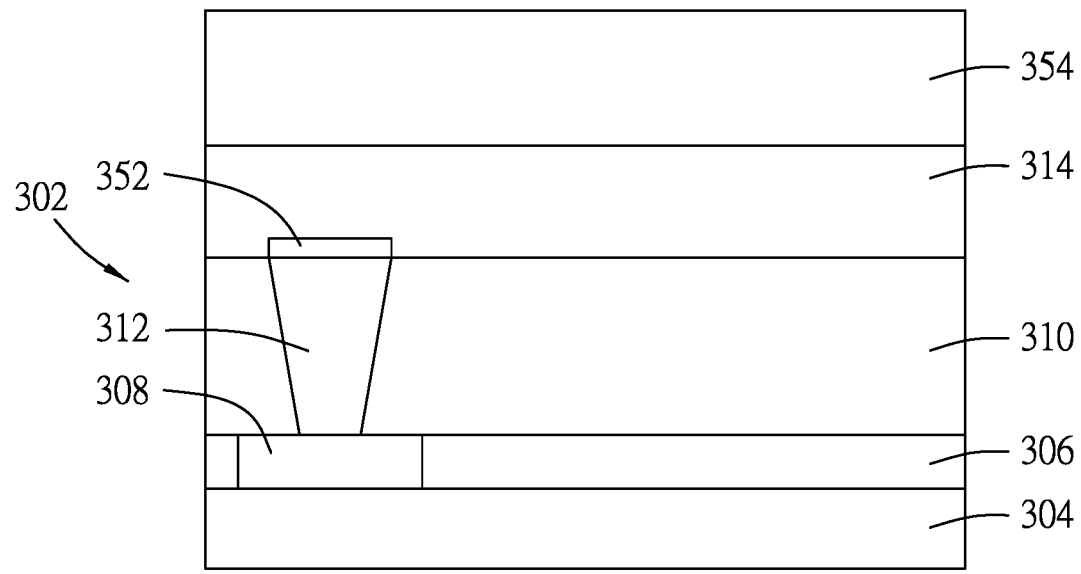

Referring to FIGS. 16 and 19, in a step 406 of the method 400, the graphene feature 314, which is similar to the graphene feature 314 of FIG. 3, is formed through a metal layer 354. Specifically, in some embodiments, the metal layer 354 is formed over the second dielectric layer 310, as shown in FIG. 18, followed by forming a carbon-containing material 356 (e.g., graphite powder, graphite blocks, etc.) over the metal layer 354. In some embodiments, the carbon-containing material 356 may serve as a carbon source for forming the graphene feature 314 of FIG. 19, and may be a solid, liquid, gas, or any combination thereof. Then the carbon-containing material 356 may be pressurized under a suitable pressure, such as a pressure less than about 1 MPa, so that carbon atoms from the carbon-containing material 356 may diffuse through the metal layer 354 and crystalize underneath the metal layer 354 to form the graphene feature 314. In some embodiments, the metal layer 354 may be made of Co, Ni, Ru, other suitable materials, or any combination thereof. In some embodiments, the metal layer 354 should be made of a metal that has high solubility for carbon, and allows carbon to diffuse therethrough. Therefore, the process of forming the graphene feature 314 via diffusion of carbon through the metal layer 354 may be referred to as a diffusion-assisted synthesis of graphene.

Figure 20:
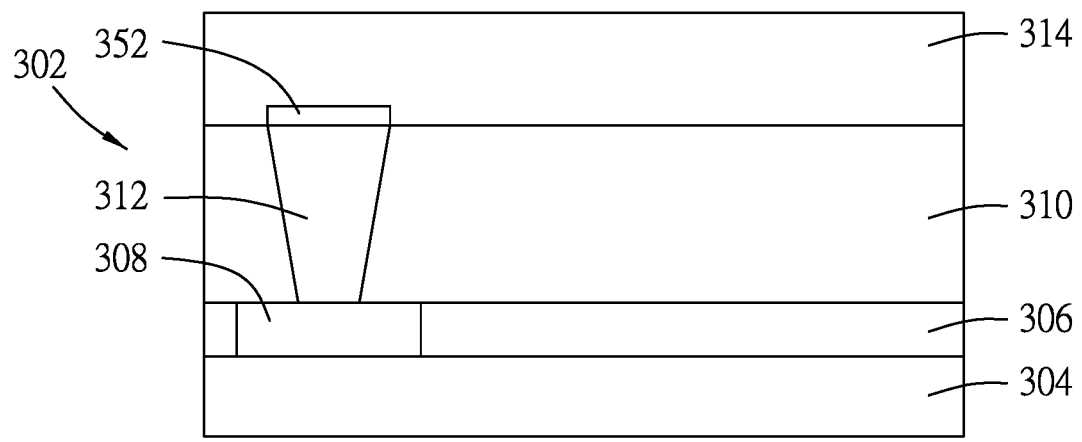

Referring to FIG. 16, in a step 408 of the method 400, the metal layer is removed. Referring to FIGS. 19 and 20, in some embodiments, the metal layer 354 may be removed by a suitable method, such as by a suitable chemical etchant while leaving the graphene feature 314 substantially unetched.

Referring to FIG. 16, in a step 410 of the method 400, the graphene feature is patterned into a plurality of the graphene structures. In some embodiments, similar to the processes shown in FIGS. 3 to 5, the graphene feature 314 shown in FIG. 20 may be patterned to obtain a plurality of the graphene structures 320 shown in FIG. 21, which are separated from each other by the graphene trenches 330 with a plurality of the protection structures 326 disposed over the graphene structures 320.

Figure 21:
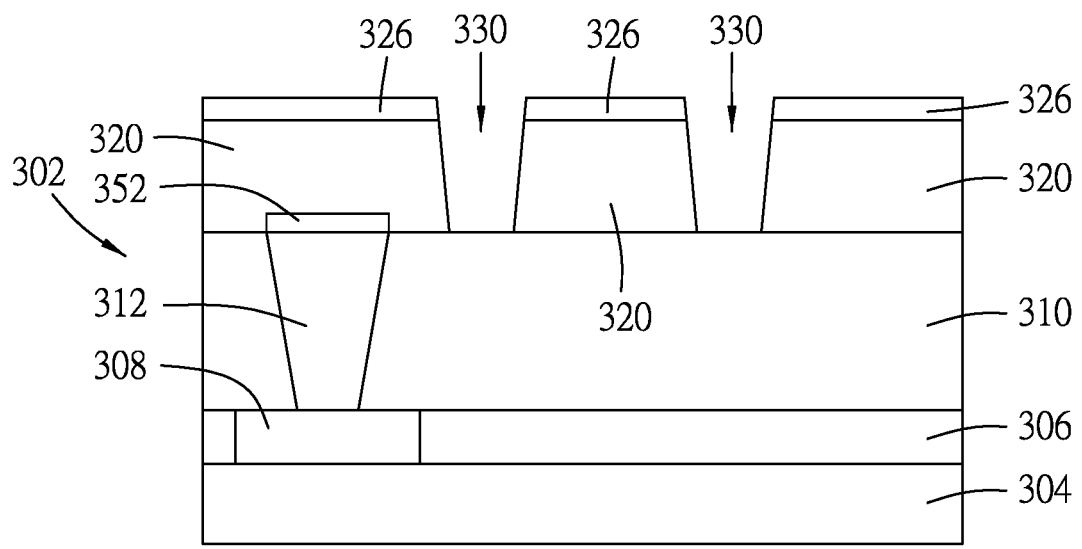
Figure 22:
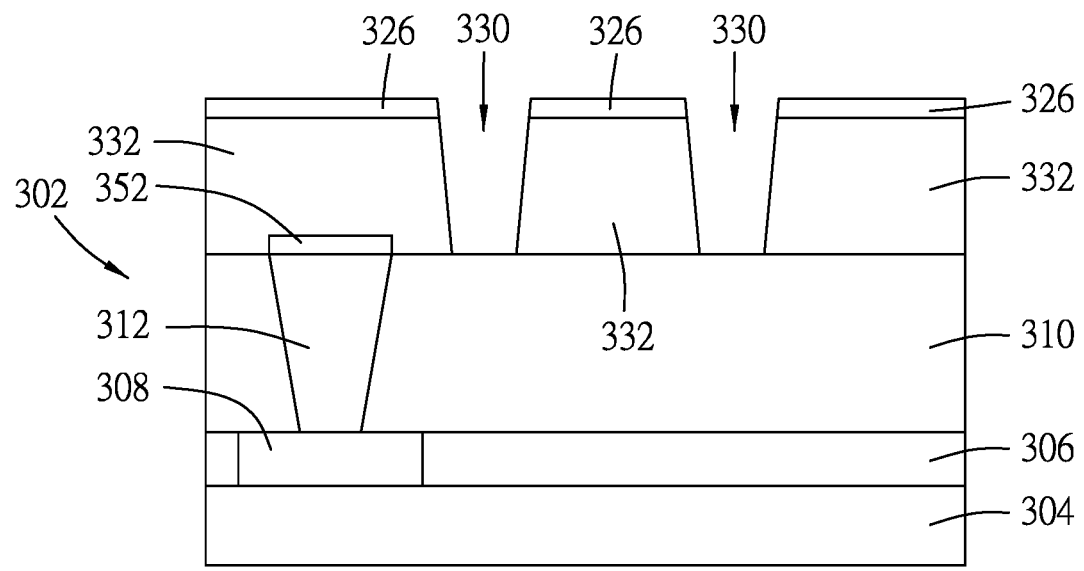

Referring to FIG. 16, in a step 412 of the method 400, the graphene structures are intercalated. Similar to the processes shown in FIGS. 5 to 7, the graphene structures 320 of FIG. 21 are intercalated to form a plurality of the intercalated graphene structures 332 shown in FIG. 22.

Figure 23:
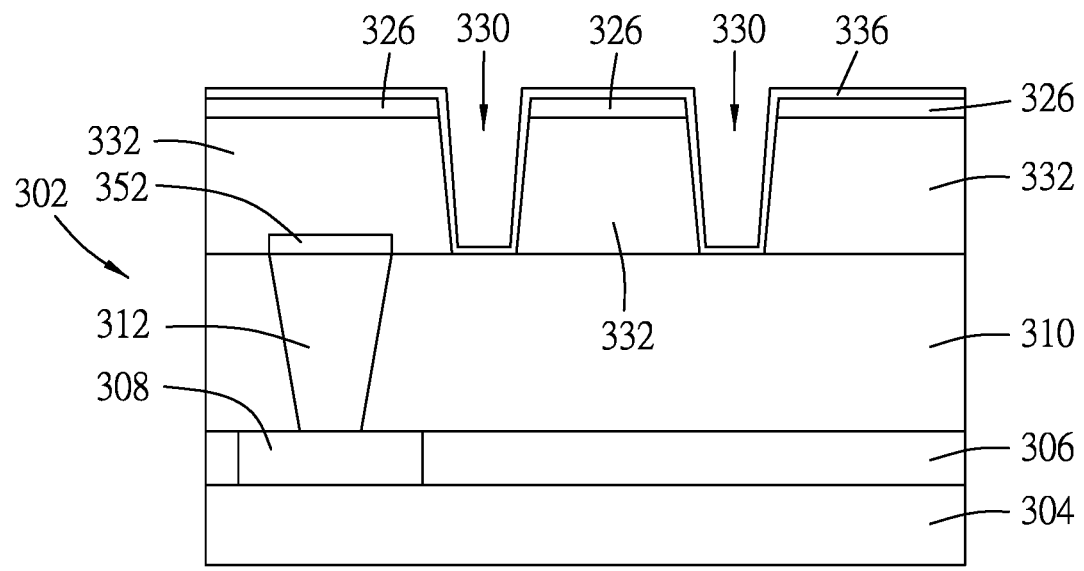

Referring to FIG. 16, in a step 414 of the method 400, the liner structure is formed. Referring to FIG. 23, similar to the process shown in FIG. 8, the liner structure 336 is formed over the protection structures 326 and in the graphene trenches 330.

Referring to FIG. 16, in a step 416 of the method 400, a plurality of the dielectric structures are formed. Referring to FIG. 24, similar to the processes shown in FIGS. 9 and 10, the dielectric structures 342 are respectively formed in the graphene trenches 330 (see FIG. 23).

Referring to FIG. 16, in a step 418 of the method 400, the dielectric element is formed. Referring to FIG. 25, similar to the processes of FIG. 11, the dielectric element 346 is formed over the protection structures 326. In some embodiments, the etch stop layer 344 may be formed prior to the formation of the dielectric element 346.

Referring to FIG. 16, in a step 420 of the method 400, the via is formed. Referring to FIG. 26, similar to the processes of FIGS. 12 and 13, the via 350 is formed, and penetrates the dielectric element 346, the etch stop layer 344, a corresponding one of the protection structures 326, and the corresponding one of the intercalated graphene structures 332, thereby obtaining the semiconductor device 300.

Referring to FIG. 26, in some embodiments, the conductive feature 352 may be electrically connected to a corresponding one of the intercalated graphene structures 332 (i.e., the left one of intercalated graphene structure 332 in FIG. 26) in an edge-contact manner, and the via 350 may be electrically connected to the corresponding one of the intercalated graphene structures 332 (i.e., the center one of the intercalated graphene structure 332 in FIG. 26) in an edge-contact manner. In some embodiments, the conductive feature 352 may have a thickness (T3) ranging from about 5 Å to about 100 Å, but other ranges of values are also within the scope of this disclosure. In some embodiments, if the thickness (T3) of the conductive feature 352 is too small, such as smaller than about 5 Å, the conductive feature 352 would be too thin to form edge-contact with the corresponding one of the intercalated graphene structures 332. In some embodiments, if the thickness (T3) of the conductive feature 352 is too large, such as greater than about 100 Å, the conductive feature 352 may be skewed off center. In some embodiments, the intercalated graphene structures 332 may contain metal from the metal layer 354 (see FIGS. 18 and 19) after the carbon atoms from the carbon-containing material 356 (see FIG. 18) pass through the metal layer 354.

Figure 27:
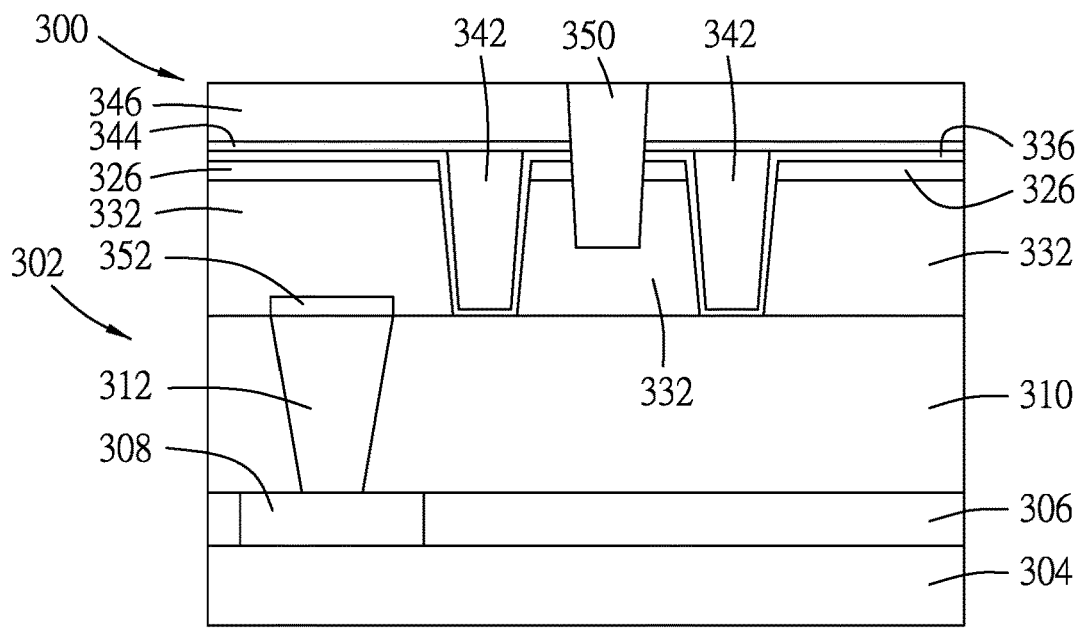
FIG. 27 illustrates an embodiment of a semiconductor device in accordance with some embodiments.

Referring to FIG. 27, similar to FIG. 15, the via 350 may only penetrate a portion of the corresponding one of the intercalated graphene structures 332, in accordance with some embodiments of this disclosure.

Figure 28:
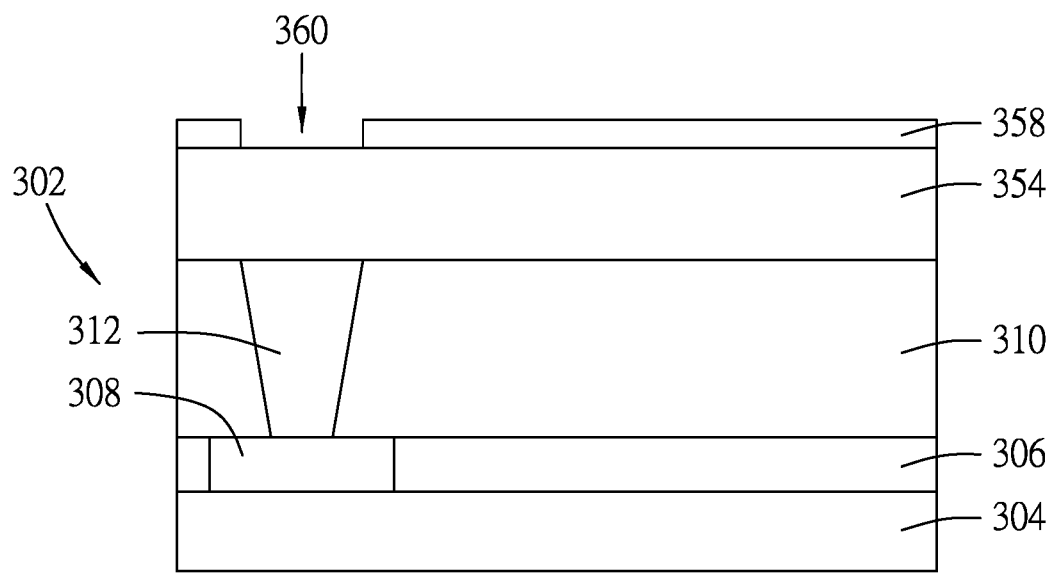
FIGS. 28 to 38 illustrate intermediate steps of a method of making a semiconductor device in accordance with some embodiments.
Figure 29:
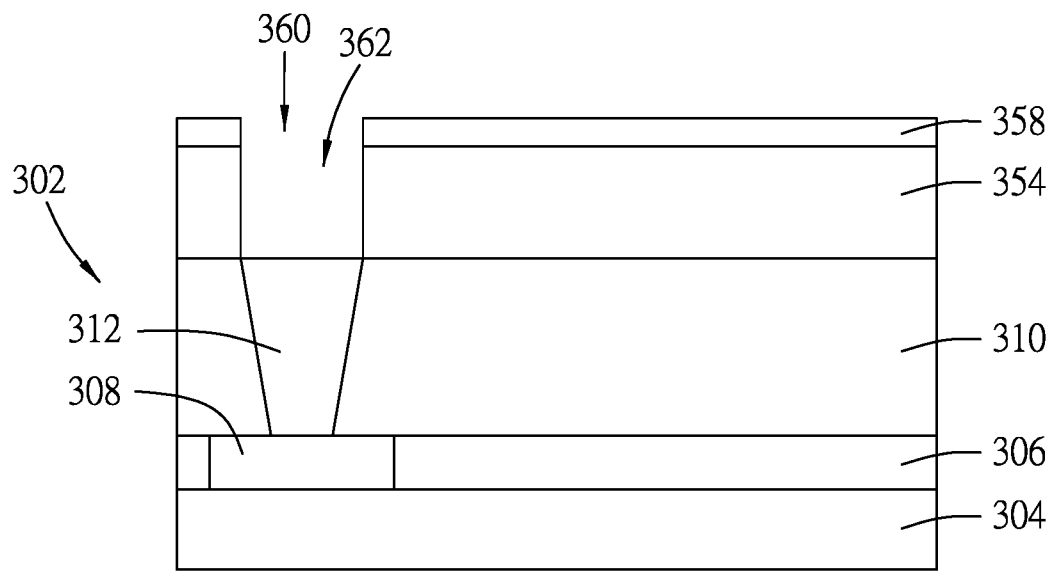
Figure 30:
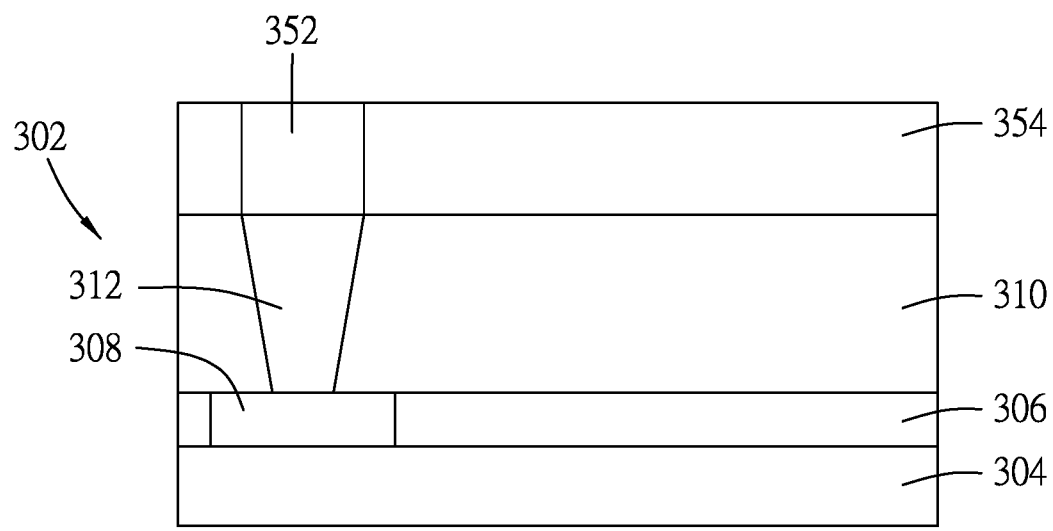

In some embodiments, the step 404 of the method 400 of FIG. 16 may be carried out as shown in FIGS. 28 to 30. Referring to FIG. 28, in some embodiments, the metal layer 354 is formed over the second dielectric layer 310, followed by forming a mask 358 with an opening 360 formed therein. Then, referring to FIG. 29, the metal layer 354 may be patterned through the opening 360 of the mask 358 to form a recess 362 in the metal layer 354, which corresponds in position to the contact feature 312 (i.e., the contact feature 312 is exposed from the recess 362 of the metal layer 354). Then, referring to FIG. 30, the mask 358 (see FIG. 29) is removed, followed by forming the conductive feature 352 in the recess 362 of the metal layer 354. That is, the conductive feature 352 is selectively formed over the contact feature 312 outside of the second dielectric layer 310.

Figure 31:
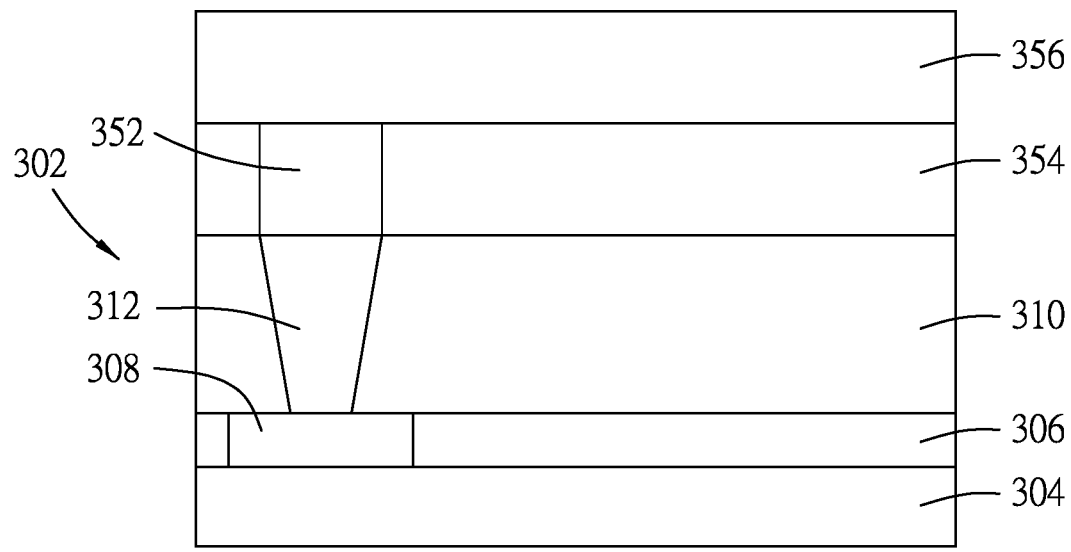
Figure 32:
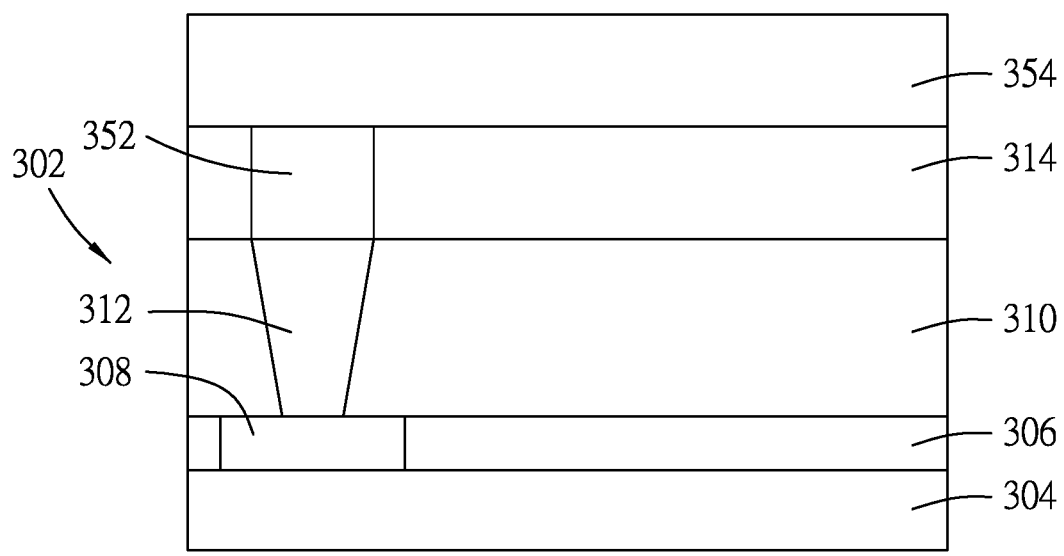

Referring to FIG. 31, similar to FIG. 18, the carbon-containing material 356 may be formed over the metal layer 354. Then, referring to FIG. 32, similar to FIG. 19, the carbon-containing material 356 of FIG. 31 may be pressurized, so that the carbon atoms of the carbon-containing material 356 pass through the metal layer 354 to crystalize to form the graphene feature 314.

Figure 33:
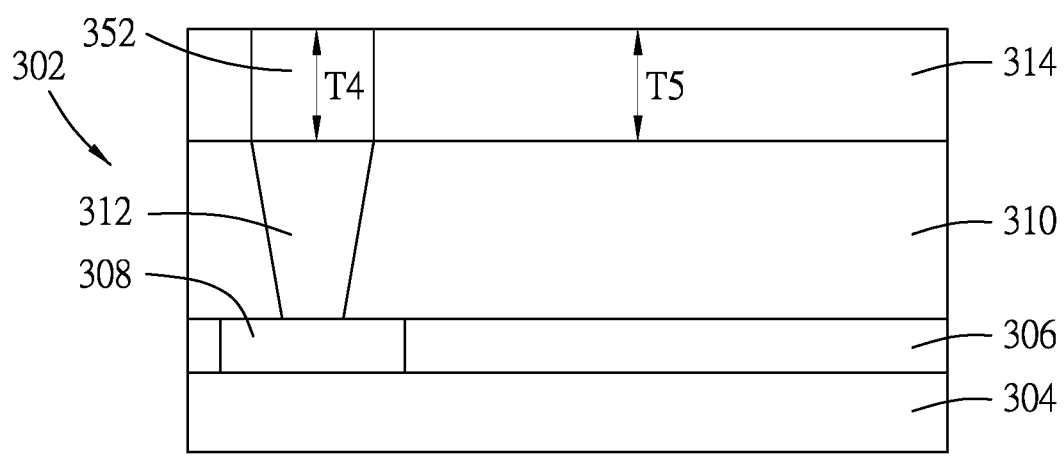
Figure 34:
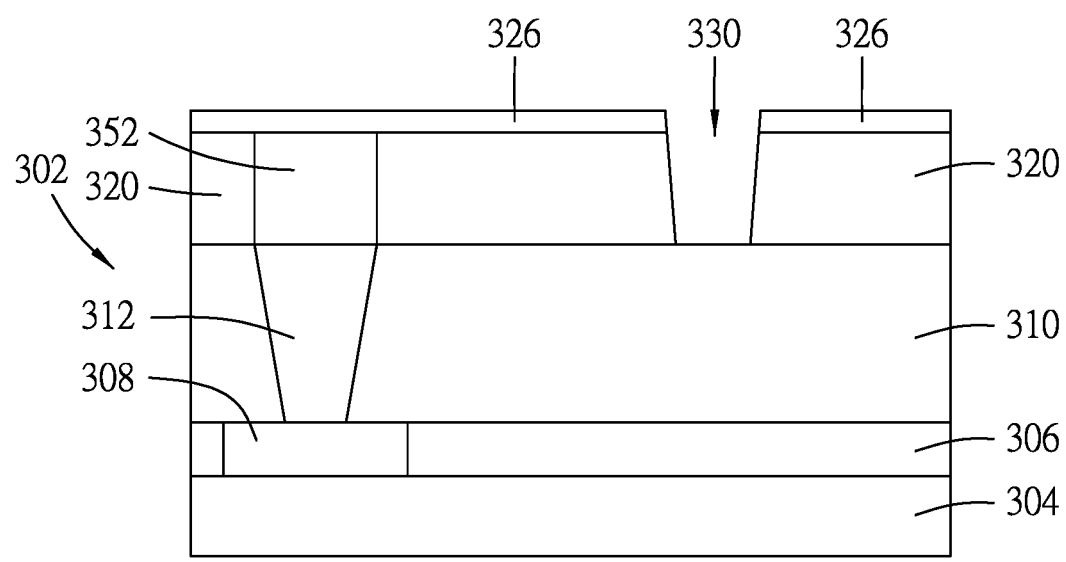

Then, referring to FIG. 33, the metal layer 354 (see FIG. 32) over the graphene feature 314 is removed. In some embodiments, the conductive feature 352 has a thickness (T4) that is substantially equal to a thickness (T5) of the graphene feature 314. Then, referring to FIG. 34 (analogous to FIG. 21) the graphene feature 314 shown in FIG. 33 may be patterned to obtain a plurality of the graphene structures 320 shown in FIG. 34, which are separated from each other by the graphene trenches 330 (only one is schematically shown in FIG. 34) with a plurality of the protection structures 326 disposed over the graphene structures 320.

Figure 35:
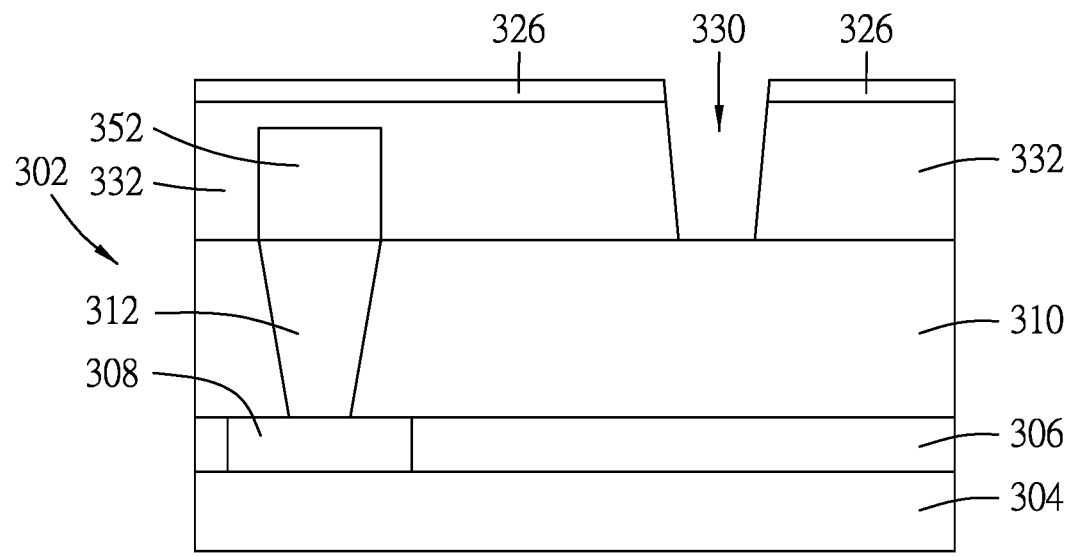

Then, referring to FIG. 35 (analogous to FIG. 22) the graphene structures 320 (see FIG. 34) are intercalated to form a plurality of the intercalated graphene structures 332.

Figure 36:
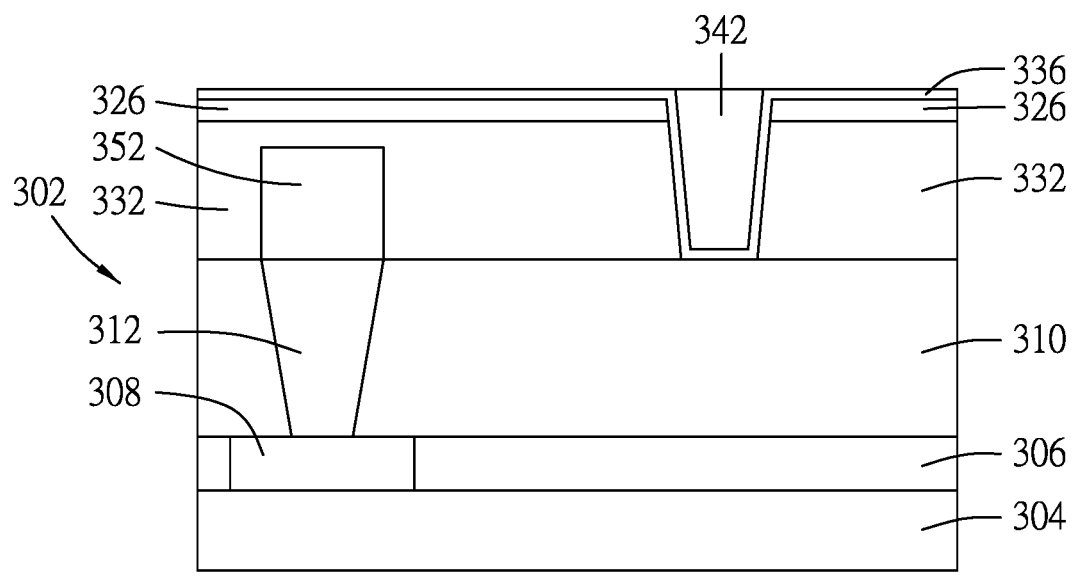

Then, referring to FIG. 36 (analogous to FIG. 24) the liner structure 336 is formed over the protection structures 326 and in the graphene trenches 330 (see FIG. 35), and the dielectric structures 342 (only one is shown in FIG. 36) are formed in the graphene trenches 330.

Figure 37:
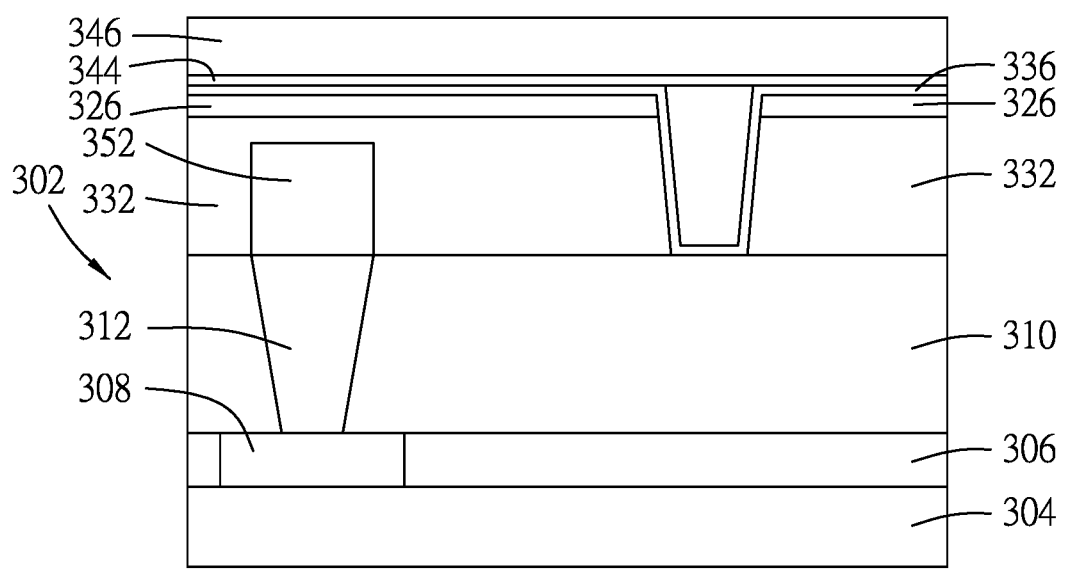

Then, referring to FIG. 37 (analogous to FIG. 25) the dielectric element 346 is formed over the protection structures 326. In some embodiments, the etch stop layer 344 may be formed prior to the formation of the dielectric element 346.

Figure 38:
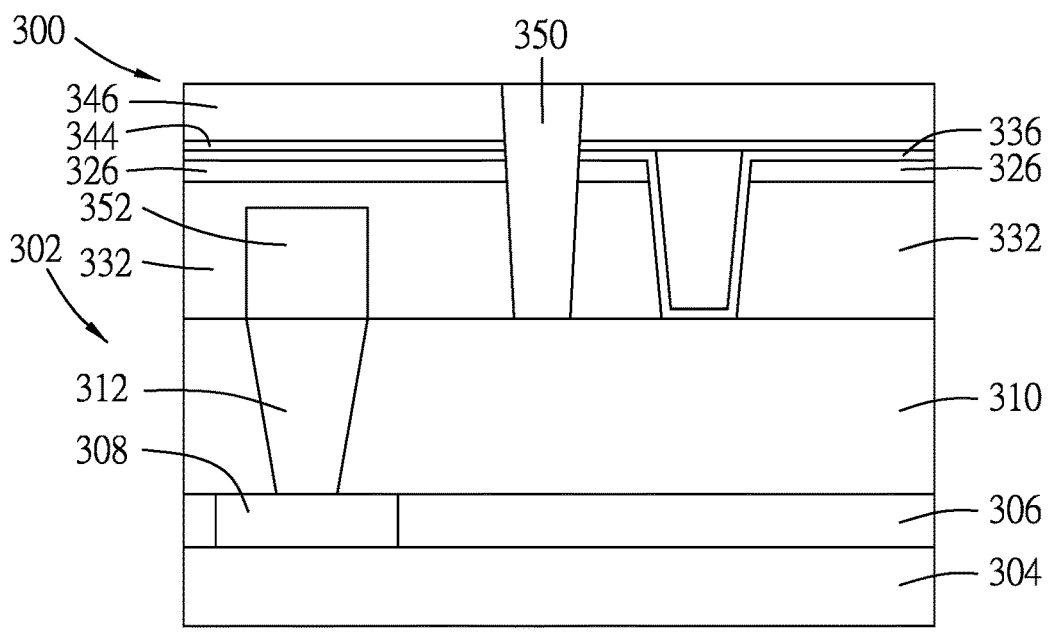

Then, referring to FIG. 38 (analogous to FIG. 26) the via 350 is formed, and penetrates the dielectric element 346, the etch stop layer 344, a corresponding one of the protection structures 326, and the corresponding one of the intercalated graphene structures 332, thereby obtaining the semiconductor device 300.

Figure 39:
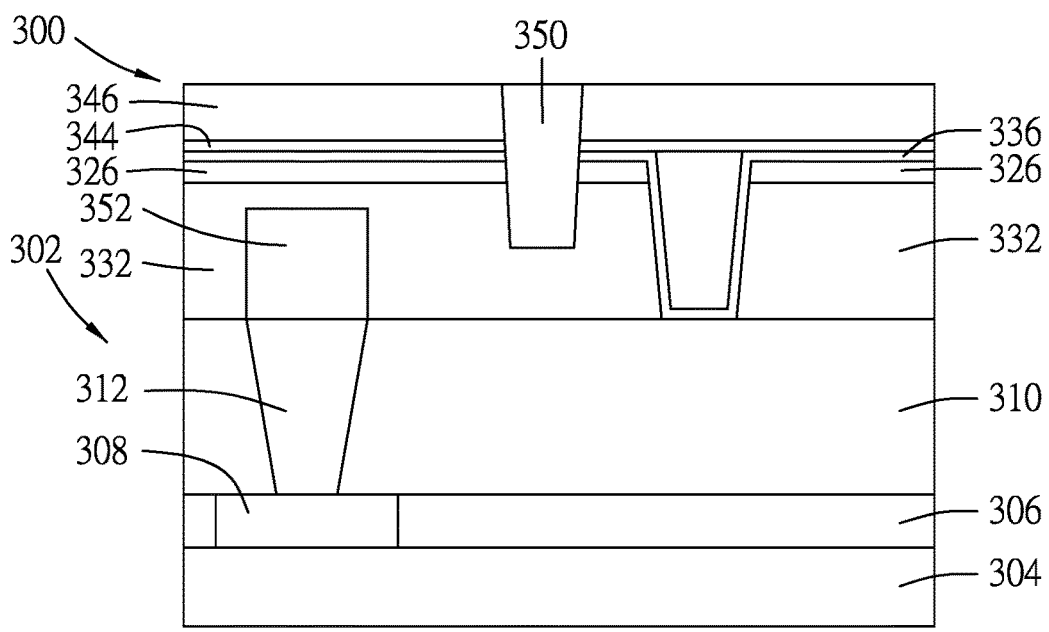
FIG. 39 illustrates an embodiment of a semiconductor device in accordance with some embodiments.

Referring to FIG. 39 (analogous to FIG. 27) the via 350 may only penetrate a portion of the corresponding one of the intercalated graphene structures 332, in accordance with some embodiments of this disclosure.

The embodiments of the present disclosure have some advantageous features. With either or both of the conductive feature 352 and the via 350 being connected to the intercalated graphene structures 332 as edge contacts, the resistance between the conductive feature 352 and the intercalated graphene structures 332 or between the via 350 and the intercalated graphene structures 332 can be reduced.

In accordance with some embodiments of the present disclosure, a semiconductor device includes a semiconductor substrate, a plurality of intercalated graphene structures and a via. The intercalated graphene structures are disposed over the semiconductor substrate. Each of the intercalated graphene structures includes a plurality of graphene layers each extending substantially parallel to the semiconductor substrate. The via extends into at least a portion of one of the intercalated graphene structures toward the semiconductor substrate, and is in contact with edges of corresponding ones of the graphene layers of the one of the intercalated graphene structures.

In accordance with some embodiments of the present disclosure, the via completely penetrates the one of the intercalated graphene structures.

In accordance with some embodiments of the present disclosure, the via has a portion that extends into the one of the intercalated graphene structures and has a height which is at least one-third of a thickness of the one of the intercalated graphene structures.

In accordance with some embodiments of the present disclosure, the semiconductor device further includes a conductive feature that is disposed between the semiconductor substrate and the via, that extends into at least a portion of one of the intercalated graphene structures away from the semiconductor substrate, and that is in contact with edges of corresponding ones of the graphene layers of the another one of the intercalated graphene structures.

In accordance with some embodiments of the present disclosure, the semiconductor device further includes a plurality of protection structures that are respectively disposed on the intercalated graphene structures, and a plurality of dielectric structures that separate the intercalated graphene structures from each other and that separate the protection structures from each other.

In accordance with some embodiments of the present disclosure, each of the protection structures has a thickness ranging from about 15 Å to about 100 Å.

In accordance with some embodiments of the present disclosure, the semiconductor device further includes a liner structure that is disposed over the protection structures and that surrounds the protection structures and the intercalated graphene structures.

In accordance with some embodiments of the present disclosure, the intercalated graphene structures includes Co, Ni, or Ru.

In accordance with some embodiments of the present disclosure, each of the intercalated graphene structures has an intercalation stage ranging from stage 1 to stage 10.

In accordance with some embodiments of the present disclosure, each of the intercalated graphene structures has a thickness that is not greater than about 1000 Å.

In accordance with some embodiments of the present disclosure, a method of making a semiconductor device includes: forming a semiconductor structure that includes a semiconductor substrate and a contact feature disposed over the semiconductor substrate; forming a graphene feature over the semiconductor structure; patterning the graphene feature into a plurality of graphene structures that are separated from each other by a plurality of graphene trenches, each of the graphene structures including a plurality of graphene layers each of which extends substantially parallel to the semiconductor substrate; intercalating the graphene structures into a plurality of intercalated graphene structures; filling the graphene trenches with a plurality of dielectric structures; and forming a via that extends into at least a portion of one of the intercalated graphene structures toward the semiconductor substrate, and that is in contact with edges of corresponding ones of the graphene layers of the one of the intercalated graphene structures.

In accordance with some embodiments of the present disclosure, the step of patterning the graphene feature includes: forming a hard mask feature over the graphene feature; patterning the hard mask feature into a plurality of hard mask structures; patterning the graphene feature into the graphene structures by using the hard mask structures as a mask; and removing top portions of the hard mask structures to form a plurality of protection structures over the graphene structures.

In accordance with some embodiments of the present disclosure, in the step of forming the via, the via entirely penetrates the one of the intercalated graphene structures.

In accordance with some embodiments of the present disclosure, a method of making a semiconductor device includes: forming a semiconductor structure that includes a semiconductor substrate and a contact feature disposed over the semiconductor substrate; forming a metal layer over the semiconductor structure; forming a carbon-containing material over the metal layer; pressurizing the carbon-containing material, so that carbon atoms from the carbon-containing material diffuse through the metal layer and crystalize underneath the metal layer to form a graphene feature; removing the metal layer; patterning the graphene feature into a plurality of graphene structures that are separated from each other by a plurality of graphene trenches, each of the graphene structures including a plurality of graphene layers each of which extends substantially parallel to the semiconductor substrate; intercalating the graphene structures into a plurality of intercalated graphene structures; filling the graphene trenches with a plurality of dielectric structures; and forming a via that extends into at least a portion of one of the intercalated graphene structures toward the semiconductor substrate, and that is in contact with edges of corresponding ones of the graphene layers of the one of the intercalated graphene structures.

In accordance with some embodiments of the present disclosure, after pressurizing the carbon-containing material, the graphene feature thus formed contains metal from the metal layer.

In accordance with some embodiments of the present disclosure, the method further includes selectively forming a conductive feature on the contact feature, so that after intercalating the graphene feature, the conductive feature extends into at least a portion of another one of the intercalated graphene structures and is in contact with edges of corresponding ones of the graphene layers of the another one of the intercalated graphene structures.

In accordance with some embodiments of the present disclosure, the step of selectively forming the conductive feature includes using a precursor that reacts with the contact feature to form the conductive feature.

In accordance with some embodiments of the present disclosure, the conductive feature is formed to have a thickness ranging from about 5 Å to about 100 Å.

In accordance with some embodiments of the present disclosure, the step of selectively forming the conductive feature includes: patterning the metal layer to form a recess which corresponds in position to the contact feature; and forming the conductive feature in the recess.

In accordance with some embodiments of the present disclosure, the conductive feature is formed in such a manner that a thickness of the conductive feature is substantially equal to a thickness of the graphene feature.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device comprising:
   forming a semiconductor structure that includes a semiconductor substrate and a contact feature disposed over the semiconductor substrate;
   forming a graphene feature over the semiconductor structure;
   patterning the graphene feature into a plurality of graphene structures that are separated from each other by a plurality of graphene trenches, each of the plurality of graphene structures including a plurality of graphene layers each of which extends parallel to the semiconductor substrate;
   intercalating the plurality of graphene structures into a plurality of intercalated graphene structures;
   filling the plurality of graphene trenches with a plurality of dielectric structures; and
   forming a via that extends into at least a portion of one of the plurality of intercalated graphene structures toward the semiconductor substrate, and that is in contact with edges of corresponding ones of the plurality of graphene layers of the one of the plurality of intercalated graphene structures,
   wherein a step of patterning the graphene feature includes:
   forming a hard mask feature over the graphene feature;
   patterning the hard mask feature into a plurality of hard mask structures;
   patterning the graphene feature into the plurality of graphene structures by using the plurality of hard mask structures as a mask; and
   removing top portions of the plurality of hard mask structures to form a plurality of protection structures over the plurality of graphene structures.

2. The method as claimed in claim 1, wherein, in a step of forming the via, the via entirely penetrates the one of the plurality of intercalated graphene structures.

3. A method of making a semiconductor device comprising:
  forming a semiconductor structure that includes a semiconductor substrate and a contact feature disposed over the semiconductor substrate;
  forming a metal layer over the semiconductor structure;
  forming a carbon-containing material over the metal layer;
  pressurizing the carbon-containing material, so that carbon atoms from the carbon-containing material diffuse through the metal layer and crystalize underneath the metal layer to form a graphene feature;
  removing the metal layer;
  patterning the graphene feature into a plurality of graphene structures that are separated from each other by a plurality of graphene trenches, each of the plurality of graphene structures including a plurality of graphene layers each of which extends parallel to the semiconductor substrate;
  intercalating the plurality of graphene structures into a plurality of intercalated graphene structures;
  filling the plurality of graphene trenches with a plurality of dielectric structures; and
  forming a via that extends into at least a portion of one of the plurality of intercalated graphene structures toward the semiconductor substrate, and that is in contact with edges of corresponding ones of the plurality of graphene layers of the one of the plurality of intercalated graphene structures.

4. The method as claimed in claim 3, wherein, after pressurizing the carbon-containing material, the graphene feature thus formed contains metal from the metal layer.

5. The method as claimed in claim 3, further comprising selectively forming a conductive feature on the contact feature, so that after intercalating the plurality of graphene structures, the conductive feature extends into at least a portion of another one of the plurality of intercalated graphene structures and is in contact with edges of corresponding ones of the plurality of graphene layers of the another one of the plurality of intercalated graphene structures.

6. The method as claimed in claim 5, wherein a step of selectively forming the conductive feature includes using a precursor that reacts with the contact feature to form the conductive feature.

7. The method as claimed in claim 6, wherein the conductive feature is formed to have a thickness ranging from 5 Å to 100 Å.

8. The method as claimed in claim 5, wherein a step of selectively forming the conductive feature includes:
  patterning the metal layer to form a recess which corresponds in position to the contact feature; and
  forming the conductive feature in the recess.

9. The method as claimed in claim 8, wherein the conductive feature is formed in such a manner that a thickness of the conductive feature is equal to a thickness of the graphene feature.

10. The method as claimed in claim 3, wherein the carbon-containing material is pressurized under a pressure of less than 1 MPa.

11. A method of making a semiconductor device comprising:
  forming a semiconductor structure that includes a semiconductor substrate and a contact feature disposed over the semiconductor substrate in a first direction normal to the semiconductor substrate;
  forming a plurality of intercalated graphene structures and a plurality of dielectric structures which are disposed on the semiconductor structure and which are alternated with one another in a second direction that is transverse to the first direction and that is parallel to the semiconductor substrate, each of the plurality of intercalated graphene structures including a plurality of graphene layers each extending in the second direction;
  forming a liner structure to separate the plurality of intercalated graphene structures from the plurality of dielectric structures; and
  forming a via that extends into at least a portion of one of the plurality of intercalated graphene structures toward the semiconductor substrate, and that is in contact with edges of corresponding ones of the plurality of graphene layers of the one of the plurality of intercalated graphene structures.

12. The method as claimed in claim 11, further comprising, after formation of the semiconductor structure and before formation of the plurality of intercalated graphene structures and the plurality of dielectric structures, selectively forming a conductive feature on the contact feature opposite to the semiconductor substrate.

13. The method as claimed in claim 12, wherein the plurality of dielectric structures are formed after formation of the liner structure.

14. The method as claimed in claim 13, wherein the plurality of intercalated graphene structures are formed by:
  forming a metal layer on the conductive feature and the semiconductor structure;
  forming a carbon-containing material on the metal layer opposite to the semiconductor structure;
  pressurizing the carbon-containing material, so that carbon atoms from the carbon-containing material diffuse through the metal layer and crystalize underneath the metal layer to form a graphene feature;
  removing the metal layer;
  patterning the graphene feature into a plurality of graphene structures that are spaced apart from one another by a plurality of graphene trenches; and
  intercalating the plurality of graphene structures into the plurality of intercalated graphene structures.

15. The method as claimed in claim 14, wherein the plurality of dielectric structures are formed in the plurality of graphene trenches, respectively.

16. The method as claimed in claim 11, wherein the via has a portion that extends into the one of the plurality of intercalated graphene structures and that has a height which is at least one third of a thickness of the one of the plurality of intercalated graphene structures.

17. The method as claimed in claim 11, wherein each of the plurality of intercalated graphene structures includes cobalt, nickel, ruthenium, or combinations thereof.

18. The method as claimed in claim 11, wherein each of the plurality of intercalated graphene structures is formed to have an intercalation stage ranging from stage 1 to stage 10.

19. The method as claimed in claim 11, wherein each of the plurality of intercalated graphene structures is formed to have a thickness that is not greater than 1000 Å.

20. The method as claimed in claim 1, further comprising, after formation of the semiconductor structure and before formation of the graphene feature, forming a liner layer on the semiconductor structure.

* * * * *